United States Patent
Yamayoshi

(10) Patent No.: US 8,310,613 B2
(45) Date of Patent: Nov. 13, 2012

(54) ACTIVE MATRIX SUBSTRATE AND LIQUID CRYSTAL DEVICE

(75) Inventor: Kazushi Yamayoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 166 days.

(21) Appl. No.: 12/987,347

(22) Filed: Jan. 10, 2011

(65) Prior Publication Data

US 2012/0001837 A1    Jan. 5, 2012

(30) Foreign Application Priority Data

Jul. 5, 2010   (JP) ................................ 2010-152886

(51) Int. Cl.
G02F 1/136    (2006.01)
(52) U.S. Cl. .......................................... 349/47
(58) Field of Classification Search .................. None
See application file for complete search history.

(56) References Cited

U.S. PATENT DOCUMENTS

| 5,367,180 | A | * | 11/1994 | Asai et al. ................. 257/66 |
| 5,403,756 | A | * | 4/1995 | Yoshinouchi et al. ....... 438/162 |
| 5,576,555 | A | * | 11/1996 | Yamanobe et al. .......... 257/53 |
| 5,796,116 | A | | 8/1998 | Nakata et al. |
| 6,271,062 | B1 | | 8/2001 | Nakata et al. |
| 2012/0104386 | A1 | * | 5/2012 | Miyairi et al. ............. 257/43 |

FOREIGN PATENT DOCUMENTS

| JP | 8-97436 | 4/1996 |
| JP | 2003-17505 | 1/2003 |

OTHER PUBLICATIONS

Takuo Kaitoh et al., "SELAX Technology for Poly-Si TFTs Integrated with Amorphous-Si TFTs", SID Technology Digest, 2008, pp. 1066-1069.

* cited by examiner

*Primary Examiner* — Sung Pak
(74) *Attorney, Agent, or Firm* — Oblon, Spivak, McClelland, Maier & Neustadt, L.L.P.

(57) ABSTRACT

An active matrix substrate includes a plurality of pairs of a TFT including a gate electrode and a gate insulating film formed on an insulating substrate, a channel layer made of at least one of a crystalline semiconductor film and an amorphous semiconductor film, and a source electrode and a drain electrode, and a pixel electrode arranged in an array. The channel layer is formed within a formation area of the gate electrode, the source electrode and the drain electrode are formed within a formation area of the channel layer, a source line is formed above the gate insulating film in a position spaced from the gate electrode, and the source line is connected to the source electrode through a connection line made of an oxide conductive film formed on top of the source electrode and extending from the top of the source electrode.

19 Claims, 15 Drawing Sheets

US 8,310,613 B2

ACTIVE MATRIX SUBSTRATE AND LIQUID CRYSTAL DEVICE

INCORPORATION BY REFERENCE

This application is based upon and claims the benefit of priority from Japanese patent application No. 2010-152886, filed on Jul. 5, 2010, the disclosure of which is incorporated herein in its entirety by reference.

BACKGROUND OF THE INVENTION

1. Field of the Invention

The present invention relates to an active matrix substrate in which a plurality of pairs of a thin film transistor (which is abbreviated as "TFT") and a pixel electrode are arranged in an array, and a liquid crystal device including the same.

2. Description of Related Art

An electro-optic device such as an active matrix type liquid crystal device or an organic electroluminescence (EL) device which uses a thin film transistor (TFT) as a pixel switching element is utilized as a flat panel display or the like for its advantage of low power consumption and thin thickness.

The flat panel display is expected to move to further upsizing and higher definition (HD), which will lead to an increase in the need for a TFT having higher driving capability than an amorphous silicon TFT (a-Si TFT) that has been commonly used as an image switching element.

As the TFT having higher driving capability than the a-Si TFT, a crystalline silicon TFT such as a polycrystalline silicon TFT (pc-Si TFT) or a microcrystalline silicon TFT (μ-Si TFT) is under review.

In recent years, in order to achieve a narrower frame and cost reduction of the liquid crystal device or the EL device, a driver circuit integral type in which a driver circuit such as a source driver or a gate driver using a drive TFT is formed on the same substrate as a pixel area having a pixel switching TFT has been developed. By forming the driver circuit on the same substrate as the pixel area, the cost of an external IC chip can be reduced, and the frame can be narrowed because there is no need for an IC chip mounting area.

Because a higher drive voltage is applied for a longer period of time to the drive TFT compared to the pixel switching TFT, degradation of electrical characteristics increases. In such an application as well, a crystalline silicon TFT such as a polycrystalline silicon TFT (pc-Si TFT) or a microcrystalline silicon TFT (μc-Si TFT) with high reliability and high mobility is suitably used.

Because a trap density and a defect level due to crystal defect are suppressed in the crystalline silicon film such as pc-Si or μc-Si, use of such a film enables obtainment of a TFT having good device characteristics with low threshold voltage shift and high field-effect mobility.

Particularly, μc-Si has uniform crystals with a crystal size of 100 nm or less in general, and use of μc-Si reduces variation of TFT device characteristics, which is preferable.

As a method of forming a crystalline Si film such as pc-Si or μc-Si, a method that forms an a-Si film and then polycrystallizes the a-Si film by laser annealing that applies laser light (cf. Claim 1 etc. of Japanese Unexamined Patent Application Publication No. 2003-17505) and a method that deposits a μc-Si film directly by plasma chemical vapor deposition (CVD) (cf. Paragraph 0041 etc. of Japanese Unexamined Patent Application Publication No. H08-97436) are known.

As a pixel switching TFT of a liquid crystal device, an inverted staggered TFT is widely used. Further, a plurality of photolithography process steps are necessary to manufacture a TFT, and it is desirable to reduce the number of photolithography process steps. Therefore, a back-channel-etch type that etches a channel backside is often used in the inverted staggered TFT because it can be manufactured with a relatively small number of photolithography process steps.

In the case of using a crystalline Si film such as a pc-Si film or a μc-Si film as a channel layer in the above-described back-channel-etch type TFT, an a-Si film is generally laminated thereon. This is for the following reason.

When the back-channel etching is performed, it is very difficult to ensure the etching selectivity between the ohmic contact layer (n-layer) connected to the source/drain electrode and the semiconductor film of the channel layer. Therefore, it is necessary to set the thickness of the semiconductor film in the channel layer to be thick and set an etching time to be long enough in consideration of variation of the film thickness of the n-layer in a substrate plane or variation of an etching rate.

However, in the method of poly-crystallizing the a-Si film by laser annealing which is disclosed in Japanese Unexamined Patent Application Publication No. 2003-17505, if the a-Si film which is formed first is deposited to be thick, the a-Si film cannot be molten enough to the lower part, and it is thus difficult to form a crystalline Si film having good crystallinity all over the thickness direction to the interface with a gate insulating film. Further, in the method of depositing the μc-Si film directly by plasma CVD which is disclosed in Japanese Unexamined Patent Application Publication No. H08-97436, because a deposition rate of the μc-Si film is very low, throughput decreases significantly to obtain a sufficient thickness.

In view of the above, a technique is employed which ensures a process margin for back-channel-etching by laminating an a-Si film with a relatively high deposition rate on a crystalline Si film formed by laser annealing or plasma CVD.

Although the TFT using a crystalline Si film such as a pc-Si film or a μc-Si film has higher driving capability than the a-Si TFT, it has an issue that leakage current is likely to occur compared to the a-Si TFT. This is for the following reason.

The back-channel-etch type inverted staggered a-Si TFT has a structure in which the side face of the a-Si film being a channel layer is in direct contact with a source electrode and a drain electrode. If this structure is applied as it is to the TFT using a crystalline Si film, a structure is such that the crystalline Si film with higher hole mobility than the a-Si film is in direct contact with the source electrode and the drain electrode.

In order to turn off the TFT, a reverse bias negative voltage is applied to a gate electrode, and, at this time, a high electric field is generated between the gate electrode and the source/drain electrode, so that a hole is injected to the crystalline Si film. In the structure in which the crystalline Si film with higher hole mobility than the a-Si film is in direct contact with the source electrode and the drain electrode, leakage current from the crystalline Si film is likely to flow into the source electrode and the drain electrode compared to the a-Si TFT.

Further, in a transmissive liquid crystal display device, light is applied from a backlight during image display. When light is applied to the crystalline Si film, an electron-hole pair is created in the film, and a positive hole moves when the gate electrode is at a negative voltage, and light leakage current is thereby generated. The leakage current flowing during the off-state of the TFT causes a loss of charges written to a pixel electrode, which can lead to display defect.

FIGS. 7(b) and 7(c) of T. Kaitoh et. al, "SELAX Technology for Poly-Si TFTs Integrated with Amorphous-Si TFTs", SID Tech. Dig., 2008, p. 1066-1069 disclose a structure in which the upper face and the side face of a laminated film of a pc-Si film and an a-Si film are covered with an ohmic contact layer made of a Si film doped with an impurity, so that the pc-Si film is not in direct contact with a source electrode and a drain electrode. This structure is applicable to a TFT which includes a channel layer having a laminated structure of a μc-Si film and an a-Si film.

In the structure shown in FIGS. 7(b) and 7(c) of T. Kaitoh et. al, the ohmic contact layer made of an Si film doped with an impurity is formed protruding to the outside of a gate electrode, and light from a backlight is applied to that part. Therefore, an electron-hole pair is created in the ohmic contact layer by the application of light, and a positive hole moves when the gate electrode is at a negative voltage, and light leakage current is thereby generated.

Further, even when the ohmic contact layer made of a Si film doped with an impurity is interposed between the laminated film of the pc-Si film and the a-Si film and the source/drain electrode, it is not possible to sufficiently prevent a positive hole generated in the crystalline Si film when the gate electrode is at a negative voltage from flowing to the source and drain electrodes.

SUMMARY OF THE INVENTION

The present invention has been accomplished in light of the above concerns, and it is desirable to provide an active matrix substrate which can be manufactured at low cost without largely altering a manufacturing method of the existing a-Si TFT active matrix substrate and which can reduce off-leakage current of the TFT.

It is particularly desirable in the present invention to provide an active matrix substrate which includes a channel layer having a crystalline semiconductor film, which includes a TFT with high driving capability, which can be manufactured at low cost without largely altering a manufacturing method of the existing a-Si TFT active matrix substrate, and which can reduce off-leakage current of the TFT.

In this specification, the "crystalline semiconductor film" involves a polycrystalline semiconductor film, a microcrystalline semiconductor film and so on.

An exemplary aspect of the present invention is an active matrix substrate that includes a plurality of pairs of an inverted staggered thin film transistor and a pixel electrode arranged in an array, the thin film transistor including a gate electrode and a gate insulating film sequentially formed on an insulating substrate, a channel layer made of at least one of a crystalline semiconductor film and an amorphous semiconductor film formed on the gate insulating film, and a source electrode and a drain electrode formed spaced from each other on the channel layer, wherein the channel layer is formed within a formation area of the gate electrode, the source electrode and the drain electrode are formed within a formation area of the channel layer, and a source line is formed above the gate insulating film in a position spaced from the gate electrode, and the source line is connected to the source electrode through a connection line made of an oxide conductive film formed on top of the source electrode and extending from the top of the source electrode.

According to the exemplary aspect of the present invention, it is possible to provide the active matrix substrate which can be manufactured at low cost without largely altering a manufacturing method of the existing a-Si TFT active matrix substrate and which can reduce off-leakage current of the TFT.

According to the exemplary aspect of the present invention, it is possible to provide the active matrix substrate which includes the channel layer having a crystalline semiconductor film, which includes the TFT with high driving capability, which can be manufactured at low cost without largely altering a manufacturing method of the existing a-Si TFT active matrix substrate, and which can reduce off-leakage current of the TFT.

According to the exemplary aspect of the present invention, it is possible to provide the high-quality active matrix substrate in which off-leakage current of the TFT is reduced even in an application where it is irradiated with light from a backlight.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

First Exemplary Embodiment

An active matrix substrate according to a first exemplary embodiment of the present invention and a liquid crystal device including the same are described hereinafter with reference to the drawings.

Figure 1:
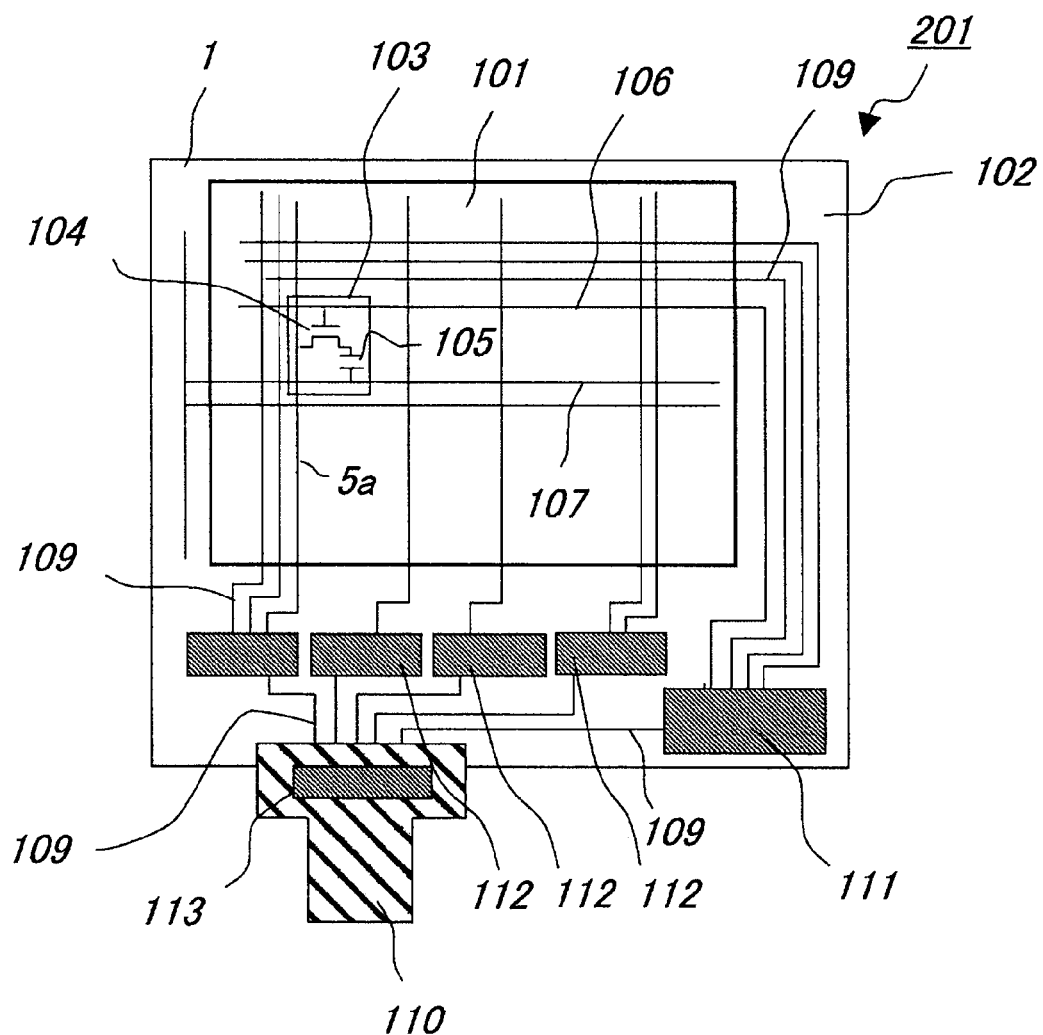
FIG. 1 is a schematic overall plan view of an active matrix substrate according to a first exemplary embodiment of the present invention.
Figure 2:
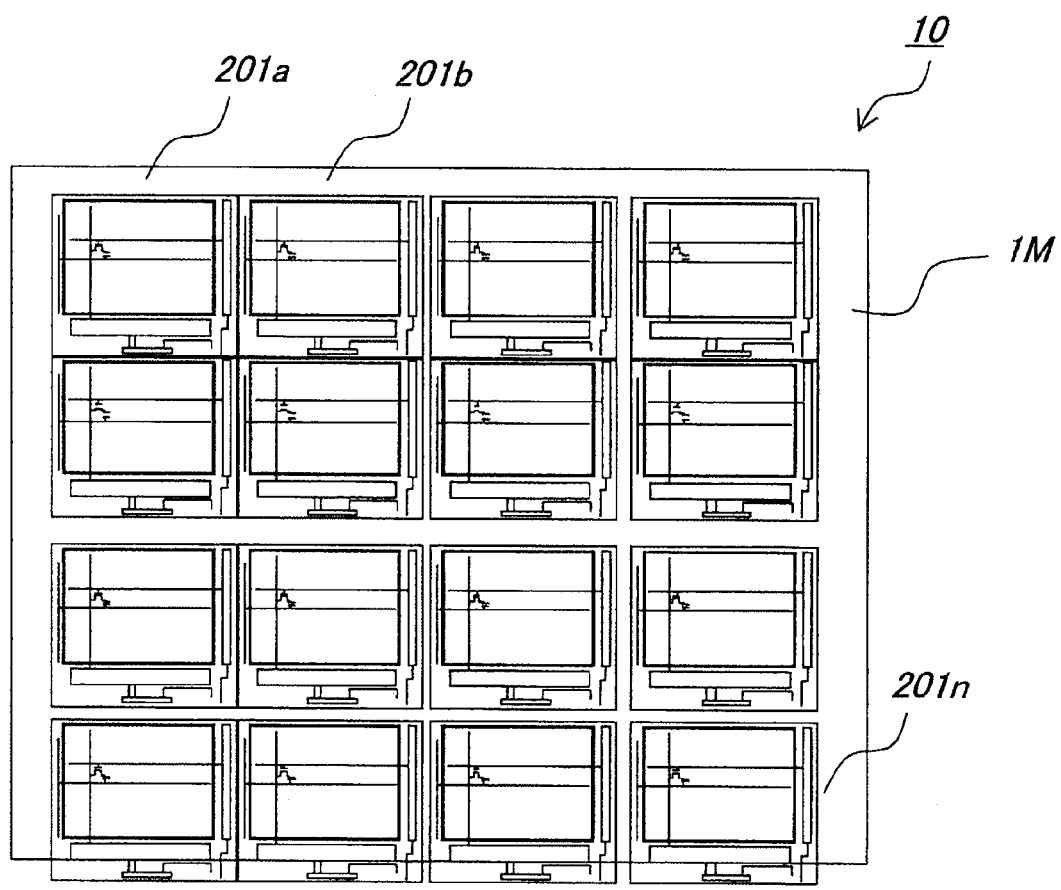
FIG. 2 is a schematic overall plan view of a mother active matrix substrate in which the active matrix substrates of FIG. 1 are formed in a mass on one large mother substrate.
Figure 3:
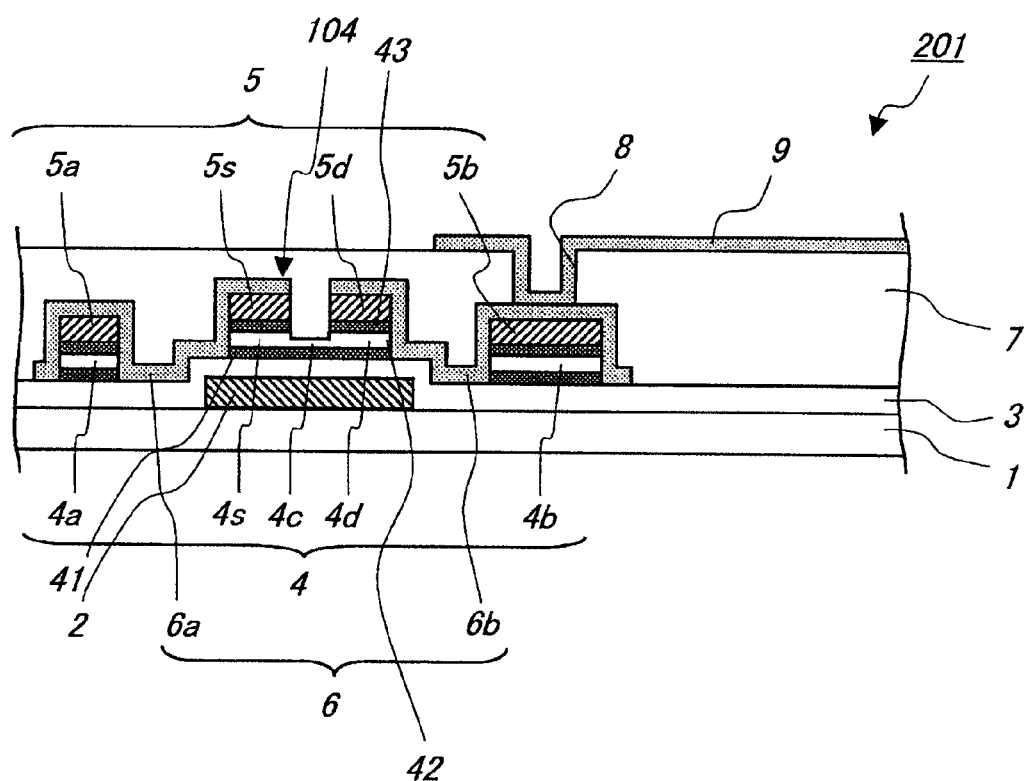
FIG. 3 is a substantial sectional view of the active matrix substrate of FIG. 1.

FIG. 1 is a schematic overall plan view of the active matrix substrate according to the exemplary embodiment. FIG. 2 is a schematic overall plan view of a mother active matrix substrate in which the active matrix substrates according to the exemplary embodiment are formed in a mass on one large mother substrate. FIG. 3 is a substantial sectional view of the active matrix substrate according to the exemplary embodiment. FIGS. 4A to 4M and FIGS. 5A to 5B are manufacturing process views of the active matrix substrate.

It should be noted that, the scale, position and so on of each element in the figures are different from the actual ones for better understanding. Hatching is omitted as appropriate in the sectional views.

The active matrix substrate according to the exemplary embodiment is suitably used for an active matrix type liquid crystal device or the like. The active matrix substrate according to the exemplary embodiment is suitable for a transmissive liquid crystal device provided with a backlight. In this exemplary embodiment, a transmissive liquid crystal display device is described as an example.

Referring to FIG. 1, an active matrix substrate 201 according to the exemplary embodiment has a structure in which various lines and electrodes are formed on an insulating substrate 1 having translucency, and it has a pixel area 101 for displaying an image and a frame area 102 surrounding the pixel area 101.

In the pixel area 101, a plurality of gate lines (scan signal lines) 106, a plurality of storage capacitor lines 107, and a plurality of source lines (display signal lines) 5a are placed. The plurality of gate lines 106 and the plurality of storage capacitor lines 107 are arranged in parallel with one another (in the horizontal direction in FIG. 1), and the plurality of source lines 5a are arranged orthogonal to the plurality of gate lines 106 and the plurality of storage capacitor lines 107 (in the vertical direction in FIG. 1).

Every region defined by one pair of the gate line 106 and the storage capacitor line 107 and one source line 5a serves as a pixel 103. In the active matrix substrate 201, a large number of pixels 103 are arranged in matrix.

In each pixel 103, at least one pixel switching TFT 104, a storage capacitor 105, and a pixel electrode 9 are placed (see FIG. 3 for the pixel electrode). The pixel switching TFT 104 and the storage capacitor 105 are connected in series, the pixel switching TFT 104 and the pixel electrode 9 are connected in series, and the storage capacitor 105 and the pixel electrode 9 are connected in parallel.

The frame area 102 of the active matrix substrate 201 has an external terminal part that includes an IC chip 111 in which a scan signal driver circuit is placed and an IC chip 112 in which a display signal driver circuit is placed. The gate lines 106 are connected to the IC chip 111 through draw lines 109, and the source lines 5a are connected to the IC chip 112 through draw lines 109.

The IC chips 111 and 112 are connected to a printed wiring board 110 such as a flexible printed circuit (FPC).

An IC chip 113 for controlling various signals is mounted on the printed wiring board 110. A gate signal (scan signal) is supplied from the IC chip 113 to the gate lines 106, and pixel switching TFTs 104 are thereby selected sequentially. Likewise, a display signal is supplied from the IC chip 113 to the source lines 5a, and a display voltage corresponding to display data is supplied to each pixel 103.

The pixel switching TFT 104 is a switching element that controls on and off of a display voltage applied to the pixel electrode 9. A gate electrode 2 (see FIG. 3) of the pixel switching TFT 104 is connected to the gate line 106, and on and off of the pixel switching TFT 104 are controlled by a gate signal supplied from the gate line 106. A source electrode 5s (see FIG. 3) of the pixel switching TFT 104 is connected to the source line 5a. When the pixel switching TFT 104 becomes the on-state, current flows from the source electrode 5s side to the drain electrode 5d side of the pixel switching TFT 104 (see FIG. 3 for the source and drain electrodes). A display voltage is thereby applied to the pixel electrode 9 connected to the drain electrode 5d. Because the storage capacitor 105 is connected in parallel with the pixel electrode 9, at the same time as when a voltage is applied to the pixel electrode 9, a voltage is applied also to the storage capacitor 105, so that charges can be stored by the storage capacitor 105 for a given length of time.

An alignment film (not shown) is disposed on the outermost surface of the active matrix substrate 201.

The transmissive liquid crystal device (not shown) includes a liquid crystal panel in which the above-described active matrix substrate 201 and a counter substrate (color filter substrate) are placed opposite to each other with a liquid crystal layer interposed therebetween, for example. The counter substrate includes a counter electrode (common electrode), a color filter, a black matrix (BM) that blocks light between pixels, an alignment film and so on. A polarizing plate and a phase difference plate are placed on the outer side of the liquid crystal panel. Further, a backlight unit is disposed on the side opposite to the viewing side of the liquid crystal panel.

In some cases, the counter electrode is placed on the active matrix substrate side like a fringe field switching (FFS) mode liquid crystal device, for example.

The liquid crystal panel and optical elements on its outside are housed in a frame made of resin or metal according to need.

In the liquid crystal device, when a display voltage is applied to the pixel electrode, an electric field corresponding to the display voltage is generated between the pixel electrode and the counter electrode.

The orientation of the liquid crystals varies by the electric field between the pixel electrode and the counter electrode. The polarization state of light passing through the liquid crystal layer is thereby changed, and the amount of light passing through the polarizing plate on the viewing side, among the light output from the backlight unit, varies. Because the orientation of the liquid crystals varies by the applied display voltage, the amount of light passing through the polarizing plate on the viewing side can be changed by controlling the display voltage for each pixel 103, so that the amount of light recognized as an image can be controlled for each pixel 103. The storage capacitor 105 contributes to keeping the display voltage.

Referring to FIG. 3, the pixel switching TFT 104 is an inverted staggered TFT that includes the gate electrode 2 and a gate insulating film 3 sequentially formed on the insulating substrate 1 having translucency, a channel layer composed of a non-doped crystalline semiconductor film 41 and a non-doped amorphous semiconductor film 42 patterned into an island shape on the gate insulating film 3, and a source electrode 5s and a drain electrode 5d formed spaced from each other on the channel layer.

In this exemplary embodiment, an ohmic contact layer (low resistance film) composed of an amorphous semiconductor film 43 doped with an N-type impurity is formed between the channel layer composed of the crystalline semiconductor film 41 and the amorphous semiconductor film 42, and the source electrode 5s and the drain electrode 5d. In the ohmic contact layer, a region between the source electrode 5s and the drain electrode 5d is removed.

In a semiconductor laminated film 4 composed of the semiconductor films 41 to 43, a region between the source electrode 5s and the drain electrode 5d is channel region 4c, a region on the source electrode 5s side is a source region 4s, and a region on the drain electrode 5d side is a drain region 4d.

The substrate 1 is an insulating substrate having translucency such as a glass substrate or a quartz substrate.

The gate insulating film 3 is made of $SiN_x$, $SiO_2$ film, or a laminated film of those and formed to cover the gate electrode 2.

The crystalline semiconductor film 41 is a non-doped polycrystalline silicon (pc-Si) film or microcrystalline silicon (μc-Si) film.

The amorphous semiconductor film 42 is a non-doped amorphous silicon (a-Si) film.

The amorphous semiconductor film 43 is an amorphous silicon film doped with an N-type impurity.

The amorphous semiconductor film 43 may be formed by implanting an impurity only to the upper layer part of the amorphous semiconductor film 42, rather than deposited separately from the amorphous semiconductor film 42.

The source electrode 5s and the drain electrode 5d are made of the same metal film 5.

In the TFT 104, the channel layer and the ohmic contact layer (the source region 4s, the channel region 4c and the drain region 4d of the semiconductor laminated film 4) are formed only inside a formation area of the gate electrode 2, and the source electrode 5s and the drain electrode 5d are formed only inside a formation area of the channel layer and the ohmic contact layer.

In the active matrix substrate 201, above the gate insulating film 3, a source line 5a electrically connected to the source electrode 5s and a drain line 5b electrically connected to the drain electrode 5d are formed in the positions spaced from the gate electrode 2.

The source line 5a and the drain line 5b are made of the metal film 5 which is the same as that of the source electrode 5s and the drain electrode 5d.

In an under layer of the source line 5a and the drain line 5b, a semiconductor laminated film 4a and a semiconductor laminated film 4b are formed, respectively. The semiconductor laminated films 4a and 4b are made of the semiconductor laminated film 4 which is the same as that of the channel layer and the ohmic contact layer of the pixel switching TFT 104.

The source line 5a and the source electrode 5s are connected through a connection line 6a having translucency and conductivity. The drain line 5b and the drain electrode 5d are connected through a connection line 6b having translucency and conductivity. The connection lines 6a and 6b are made of the same oxide conductive film 6. An indium tin oxide (ITO) film or the like is suitable as the oxide conductive film 6.

The connection line 6a covers the top face of the source electrode 5s and the side face of the source electrode 5s on the source line 5a side, the side face of the laminated film of the channel layer and the ohmic contact layer on the source line 5a side, a region between the source electrode 5s and the source line 5a on the gate insulating film 3, the side face of an under layer 4a of the source line 5a, and the side face and the top face of the source line 5a.

The connection line 6b covers the top face of the drain electrode 5d and the side face of the drain electrode 5d on the drain line 5b side, the side face of the laminated film of the channel layer and the ohmic contact layer on the drain line 5b side, a region between the drain electrode 5d and the drain line 5b on the gate insulating film 3, the side face of an under layer 4b of the drain line 5b, and the side face and the top face of the drain line 5b.

At the interface between the side face of the laminated film of the channel layer and the ohmic contact layer and the connection lines 6a and 6b or the like, an oxide film (silicon oxide film) is formed by oxygen supply from the oxide conductive film 6 made of ITO or the like.

In this exemplary embodiment, the semiconductor laminated film 4a which is the same as the laminated film of the channel layer and the ohmic contact layer of the pixel switching TFT 104 is left in a region on the source electrode 5s side of the pixel switching TFT 104 and spaced from the pixel switching TFT 104, the source line 5a is formed on the semiconductor laminated film 4a, and the source line 5a and the source electrode 5s are connected through the connection line 6a having translucency and conductivity.

Likewise, the semiconductor laminated film 4b which is the same as the laminated film of the channel layer and the ohmic contact layer of the pixel switching TFT 104 is left in a region on the drain line 5b side of the pixel switching TFT 104 and spaced from the pixel switching TFT 104, the drain line 5b is formed on the semiconductor laminated film 4b, and the drain line 5b and the drain electrode 5d are connected through the connection line 6b having translucency and conductivity.

In the active matrix substrate 201, an insulating film 7 is formed to cover the whole including the pixel switching TFT 104 and the source line 5a and the drain line 5b, and the pixel electrode 9 is formed on the insulating film 7.

The insulating film 7 has a contact hole 8 above the drain line 5b, and the connection line 6b on the drain line 5b and the pixel electrode 9 are electrically connected through the contact hole 8. In this structure, the drain electrode 5d is electrically continuous with the pixel electrode 9 through the connection line 6b, the drain line 5b and the contact hole 8.

The active matrix substrate 201 has the structure as described above.

The operation of the pixel switching TFT 104 is described briefly.

When a gate voltage is applied to the gate electrode 2 of the pixel switching TFT 104, a channel is created on the gate insulating film 3 side (specifically, the crystalline semiconductor film 41) of the channel region 4c in the semiconductor laminated film 4. In this state, when a signal voltage is supplied from the source line 5a side, current flows through the connection line 6a, the source electrode 5s, the source region 4s, the channel region 4c, the drain region 4d, the drain electrode 5d and the drain line 5b.

An example of a manufacturing method of the active matrix substrate 201 shown in FIG. 3 is described hereinafter with reference to FIGS. 4A to 4M. In this example, the method that deposits an amorphous semiconductor film and microcrystallizes the amorphous semiconductor film to thereby form a crystalline semiconductor film 41 which is a microcrystalline semiconductor film (μc-Si film) is described by way of illustration. FIGS. 4A to 4M are sectional views corresponding to FIG. 3.

Figure 4A:
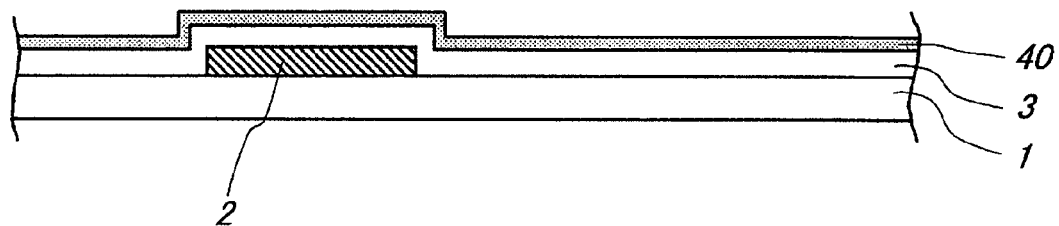
FIG. 4A is a manufacturing process view of the active matrix substrate of FIG. 1.

First, a process step shown in FIG. 4A is performed.

On the insulating substrate 1 having translucency, a metal film made of a gate electrode material is deposited by sputtering.

As the insulating substrate 1 having translucency, a glass subtract may be used, for example. As the metal film, a metal film such as aluminum (Al), molybdenum (Mo) or chromium (Cr) or an alloy film of those may be used. Particularly, a high melting point metal film of Mo, Cr, alloy of those or the like is preferred. Use of the high melting point metal film suppresses thermal damage at the time of laser light application performed later.

On the metal film, photoresist is coated by spin coating, and then the first photolithography process that performs exposure and development of the coated photoresist is conducted. The photoresist is thereby patterned into a desired shape. After that, using the resist pattern as a mask, the metal film is etched and patterned into a desired shape, and then the resist pattern is peeled off. By the above process step, the gate electrode 2 is formed into a pattern.

Although the end faces of the gate electrode 2 are perpendicular to the substrate surface in the figures, the end faces are preferably tapered. By forming the gate electrode 2 having the tapered end faces, the coating property of the gate insulating film 3 deposited subsequently is improved, and withstand voltage defect can be prevented.

On the insulating substrate 1 on which the gate electrode 2 is formed, the gate insulating film 3 and a non-doped amorphous semiconductor film (s-Si film) 40 are deposited in succession by using plasma CVD.

The gate insulating film 3 is preferably a laminated film in which a silicon nitride film ($Si_xN_y$ film) and an oxide film ($SiO_x$ film) are laminated in this order from the insulating substrate 1 side, for example.

Note that, although the gate insulating film 3 may have a different structure, having the $SiO_x$ film at least on the side coming into contact with the amorphous semiconductor film 40 enables formation of the crystalline semiconductor film 41 having good crystallinity at the interface with the gate insulating film 3 and thus having good crystallinity all over the thickness direction in the subsequent step, which is preferable.

Figure 4B:
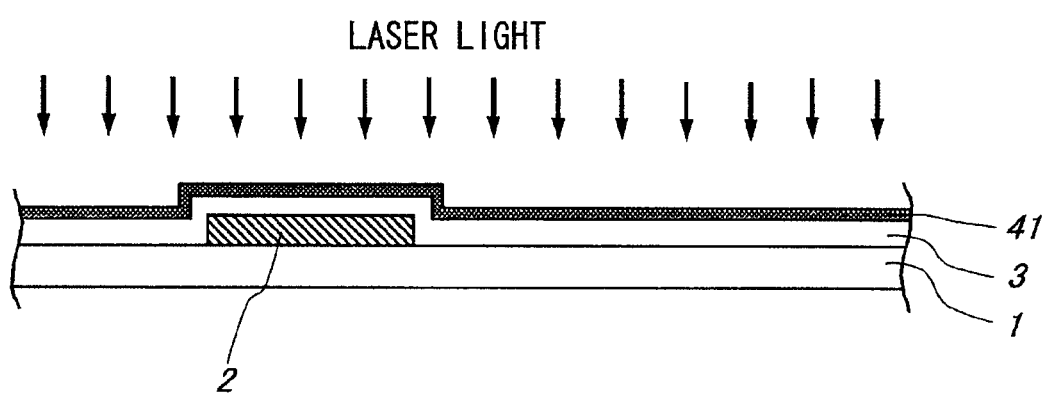
FIG. 4B is a manufacturing process view of the active matrix substrate of FIG. 1.

Next, a process step shown in FIG. 4B is performed.

In the amorphous semiconductor film 40 with the exposed surface, a natural oxide film is likely to be formed on the surface. In order to remove the natural oxide film on the surface of the amorphous semiconductor film 40 and also remove a contamination from the atmosphere, the surface of the amorphous semiconductor film 40 is cleaned by using hydrofluoric acid (specifically, dilute hydrofluoric acid or buffered hydrofluoric acid with a concentration of several mass % is preferably used).

Immediately after the cleaning, laser annealing that irradiates the amorphous semiconductor film 40 above the insulating substrate 1 by scanning the entire substrate 1 with laser light shaped into a linear beam is performed, thereby forming the crystalline semiconductor film 41 being a microcrystalline semiconductor film (μc-Si film).

In this example, the process uses excimer laser light, and completely melts the amorphous semiconductor film 40 by the laser light and makes recrystallization within a very short time. At this time, the irradiation energy density is adjusted to create microcrystals with a crystal grain diameter of 100 nm or less.

By adjusting the laser annealing condition, the crystalline semiconductor film 41 being a polycrystalline semiconductor film (pc-Si film) may be also formed.

The crystalline semiconductor film 41 may be deposited directly by plasma CVD (cf. Paragraph 0041 etc. of Japanese Unexamined Patent Application Publication No. H08-97436 described in BACKGROUND OF THE INVENTION).

Figure 4C:
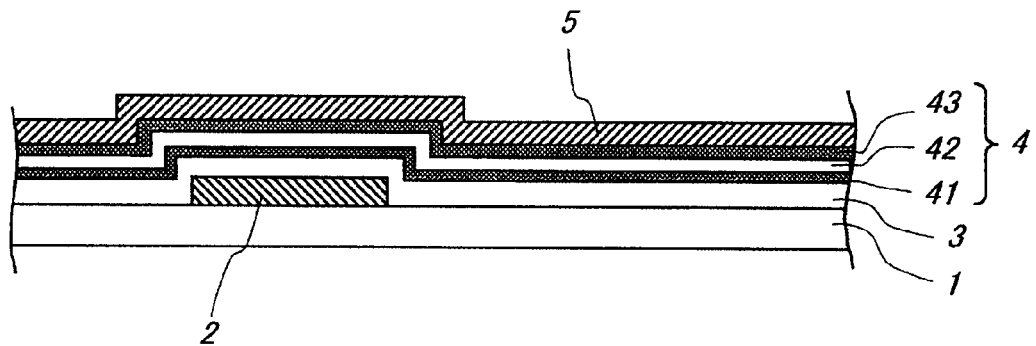
FIG. 4C is a manufacturing process view of the active matrix substrate of FIG. 1.

Then, a process step shown in FIG. 4C is performed.

After forming the crystalline semiconductor film 41 as described above, the non-doped amorphous semiconductor film (a-Si, film) 42 and the amorphous semiconductor film (a-Si film) 43 doped with an N-type impurity are deposited in succession.

Instead of depositing the amorphous semiconductor film 43 doped with an N-type impurity on the non-doped amorphous semiconductor film 42, the amorphous semiconductor film 43 doped with an N-type impurity may be formed by ion doping only at the upper layer part of the non-doped amorphous semiconductor film 42.

Further, the metal film 5 for forming the source electrode 5s, the drain electrode 5d, the source line 5a and the drain line 5b is deposited by sputtering on the semiconductor laminated film 4 composed of the crystalline semiconductor film 41, the non-doped amorphous semiconductor film 42 and the amorphous semiconductor film 43 doped with an N-type impurity.

After that, the second photolithography process is conducted.

Figure 4D:
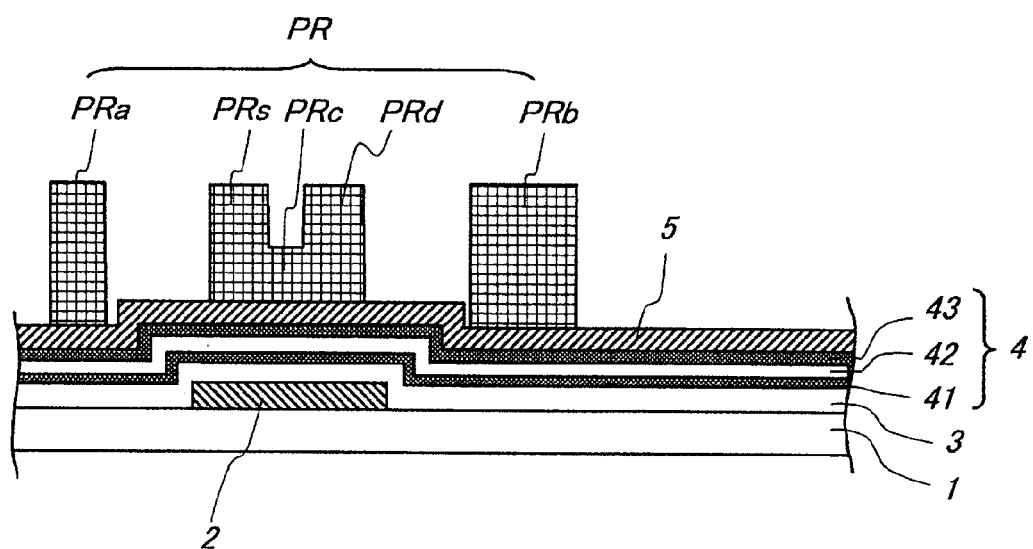
FIG. 4D is a manufacturing process view of the active matrix substrate of FIG. 1.

In the second photolithography process, a photoresist pattern PR having different film thicknesses depending on regions as shown in FIG. 4D is first formed on the metal film 5 by using a known halftone mask (a slit mask or a gray-tone mask).

In the photoresist pattern PR, a formation area PRs of the source electrode 5s, a formation area PRd of the drain electrode 5d, a formation area PRa of the source line 5a, and a formation area PRb of the drain line 5b are thick parts with a relatively large thickness, and a formation area PRc of the channel region 4c is a thin part with a relatively small thickness. Those thicknesses can be adjusted by the thickness of the photoresist and the exposure condition.

For example, in the case of a positive photoresist, the photoresist pattern PR shown in FIG. 4D can be obtained by performing exposure using a halftone mask that blocks light for a part to remain thick, allows light to pass through at substantially 100% for a part not to remain after development, and allows light to pass through partially for a part to remain thin after development and then performing development.

Figure 4E:
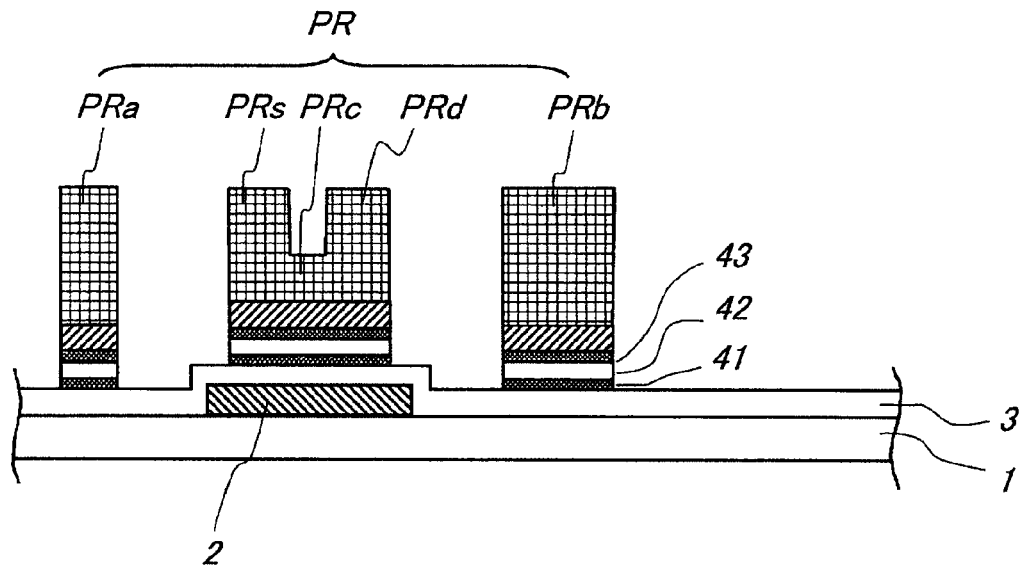
FIG. 4E is a manufacturing process view of the active matrix substrate of FIG. 1.

Then, a process step shown in FIG. 4E is performed.

The metal film 5 is etched using the above-described photoresist pattern PR as a mask. Further, the amorphous semiconductor film 43 doped with an N-type impurity, the non-doped amorphous semiconductor film 42 and the crystalline semiconductor film 41 are sequentially etched using the photoresist pattern PR as a mask.

Figure 4F:
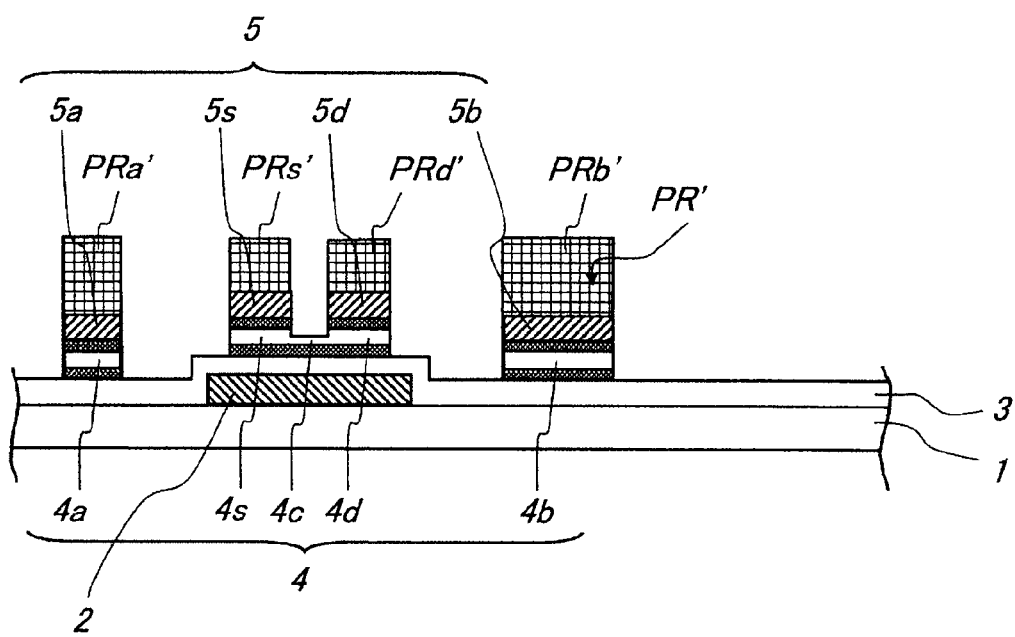
FIG. 4F is a manufacturing process view of the active matrix substrate of FIG. 1.

Then, a process step shown in FIG. 4F is performed.

The formation area PRc of the photoresist pattern PR is removed by $O_2$ ashing. At this time, the $O_2$ ashing is performed on condition that the thick parts PRs, PRd, PRa and PRb are left at a level thick enough to work as a mask, and the thin part PRc is removed completely.

In FIG. 4F, the photoresist pattern after the $O_2$ ashing is denoted by PR', and the thick parts of the same are denoted by PRs', PRd', PRa' and PRb'.

Then, the metal film 5 and the channel region of the amorphous semiconductor film 43 doped with an N-type impurity are etched (back-channel etched) using the above-described photoresist pattern PR' as a mask.

In this step, in order to completely remove the metal film 5 and the channel region of the amorphous semiconductor film 43 doped with an N-type impurity, over-etching is applied in general down to the upper layer part of the non-doped amorphous semiconductor film 42. However, the amorphous semiconductor film 42 is not completely etched away, and the channel region is left.

Figure 4G:
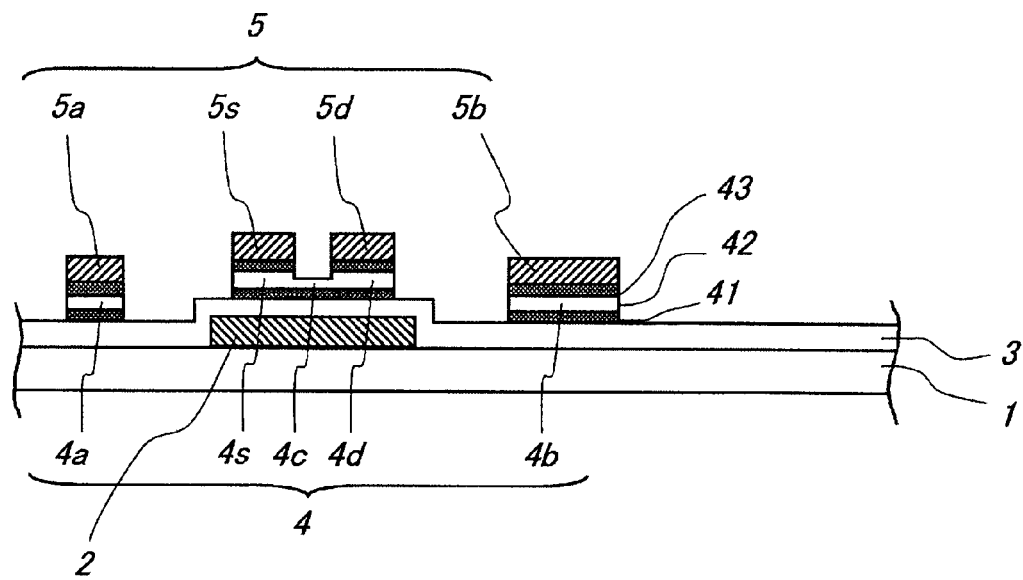
FIG. 4G is a manufacturing process view of the active matrix substrate of FIG. 1.

Then, a process step shown in FIG. 4G is performed. In this step, the photoresist pattern PR' is peeled off.

By the above process steps, the semiconductor laminated film 4 composed of the source region 4s, the channel region 4c, the drain region 4d, the under layer 4a of the source line 5a, and the under layer 4b of the drain line 5b, and the source electrode 5s, the drain electrode 5d, the source line 5a and the drain line 5b formed thereon are formed at a time.

Figure 4H:
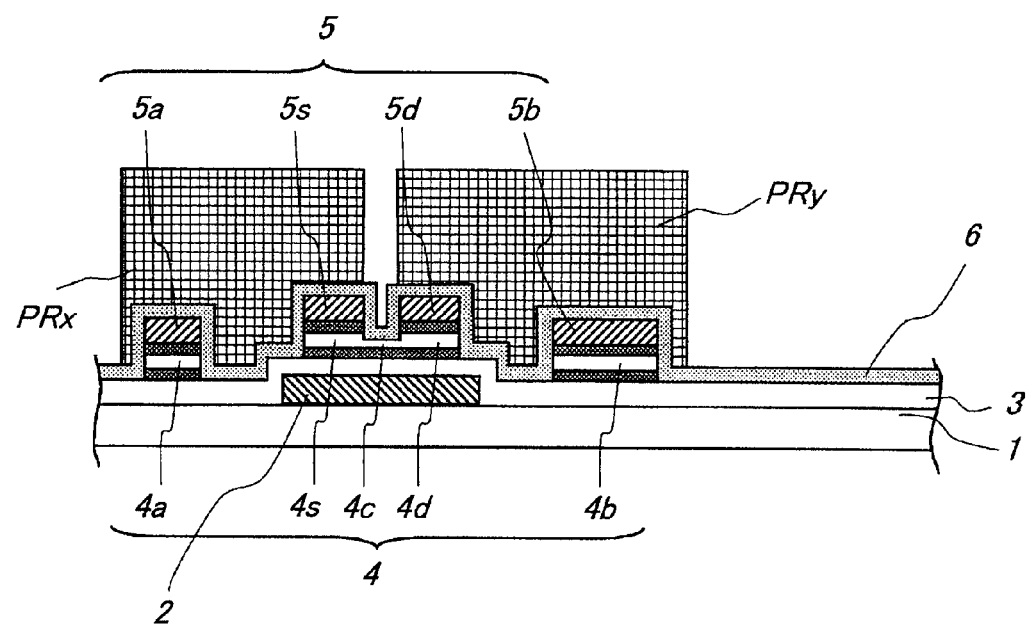
FIG. 4H is a manufacturing process view of the active matrix substrate of FIG. 1.
Figure 4I:
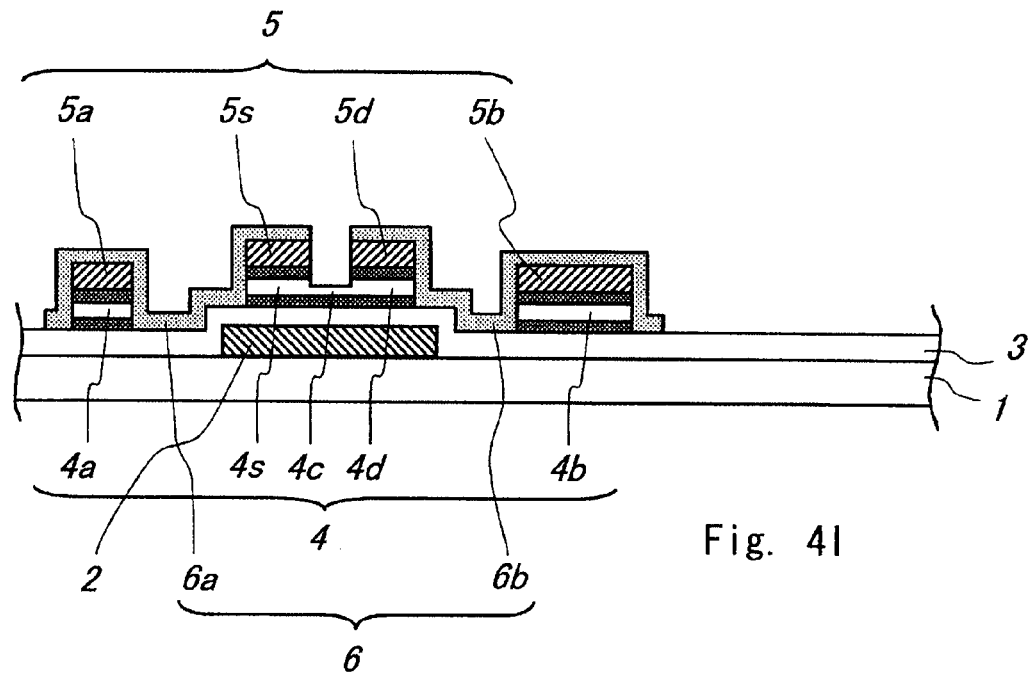
FIG. 4I is a manufacturing process view of the active matrix substrate of FIG. 1.

Then, process steps shown in FIGS. 4H to 4I are performed.

Above the substrate 1 shown in FIG. 4G, an indium tin oxide (ITO) film, for example, is deposited as the oxide conductive film 6 by sputtering.

After that, photoresist patterns PRx and Pry are formed by the third photolithography process. The photoresist pattern PRx is a mask for a formation area of the connection line 6a between the source electrode 5s and the source line 5a, and the photoresist pattern PRy is a mask for a formation area of the connection line 6b between the drain electrode 5d and the drain line 5b.

The oxide conductive film 6 is etched using the photoresist patterns PRx and Pry as a mask, and the photoresist patterns PRx and Pry are peeled off after that.

By the above process steps, the connection line 6a that covers the top face of the source electrode 5s and the side face of the source electrode 5s on the source line 5a side, the side face of the laminated film of the channel layer and the ohmic contact layer on the source line 5a side, a region between the source electrode 5s and the source line 5a on the gate insulating film 3, the side face of the under layer 4a of the source line 5a, and the side face and the top face of the source line 5a, and the connection line 6b that covers the top face of the drain electrode 5d and the side face of the drain electrode 5d on the drain line 5b side, the side face of the laminated film of the channel layer and the ohmic contact layer on the drain line 5b side, a region between the drain electrode 5d and the drain line 5b on the gate insulating film 3, the side face of the under layer 4b of the drain line 5b, and the side face and the top face of the drain line 5b are formed.

By thermal history in a post-process, an oxide film (silicon oxide film) is formed by oxygen supply from the oxide conductive film 6 made of ITO or the like at the interface between the side face on the source line 5a side and the side face on the drain line 5b side of the laminated film of the channel layer and the ohmic contact layer and the connection lines 6a and 6b or the like.

Although the oxide film is generated spontaneously using the thermal history in the post-process, heat treatment may be performed separately in the post-process in order to promote formation of the oxide film.

Figure 4J:
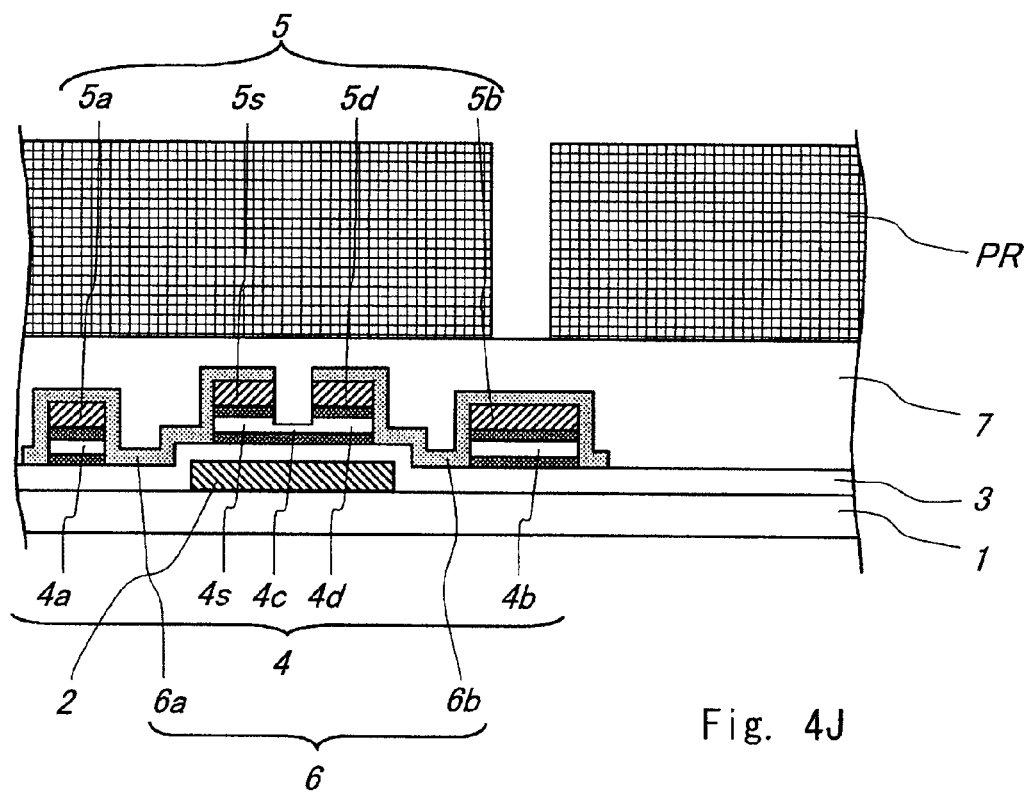
FIG. 4J is a manufacturing process view of the active matrix substrate of FIG. 1.

Then, a process step shown in FIG. 4J is performed.

As the insulating film 7, a silicon nitride film ($Si_xN_y$ film) is deposited, for example. Then, the photoresist pattern PR having an opening in the formation area of the contact hole 8 is formed by the fourth photolithography process.

Figure 4K:
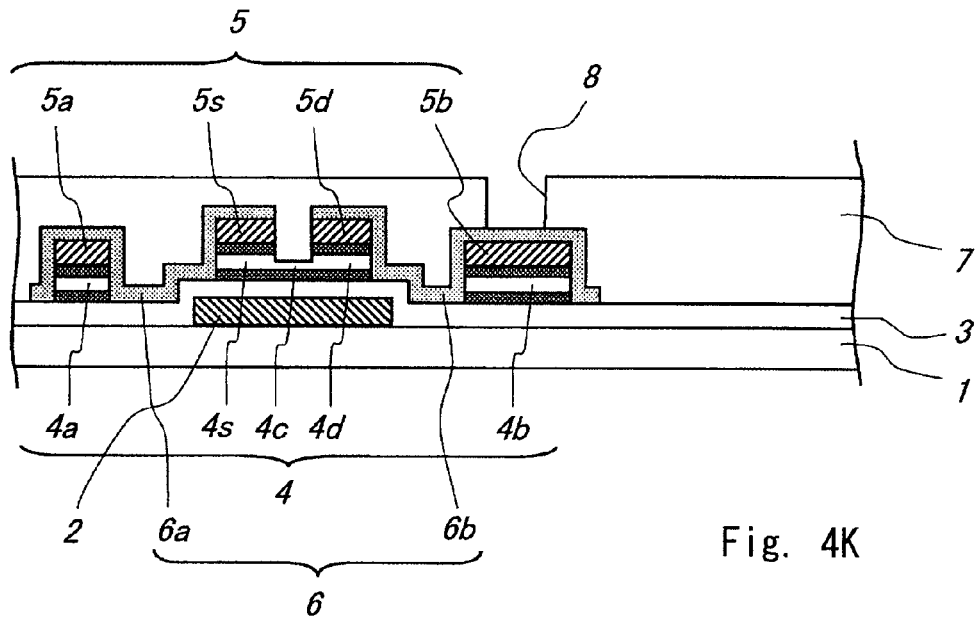
FIG. 4K is a manufacturing process view of the active matrix substrate of FIG. 1.

Then, a process step shown in FIG. 4K is performed.

The contact hole 8 is created in the insulating film 7 using the photoresist pattern PR as a mask, and then the photoresist pattern PR is peeled off.

Figure 4L:
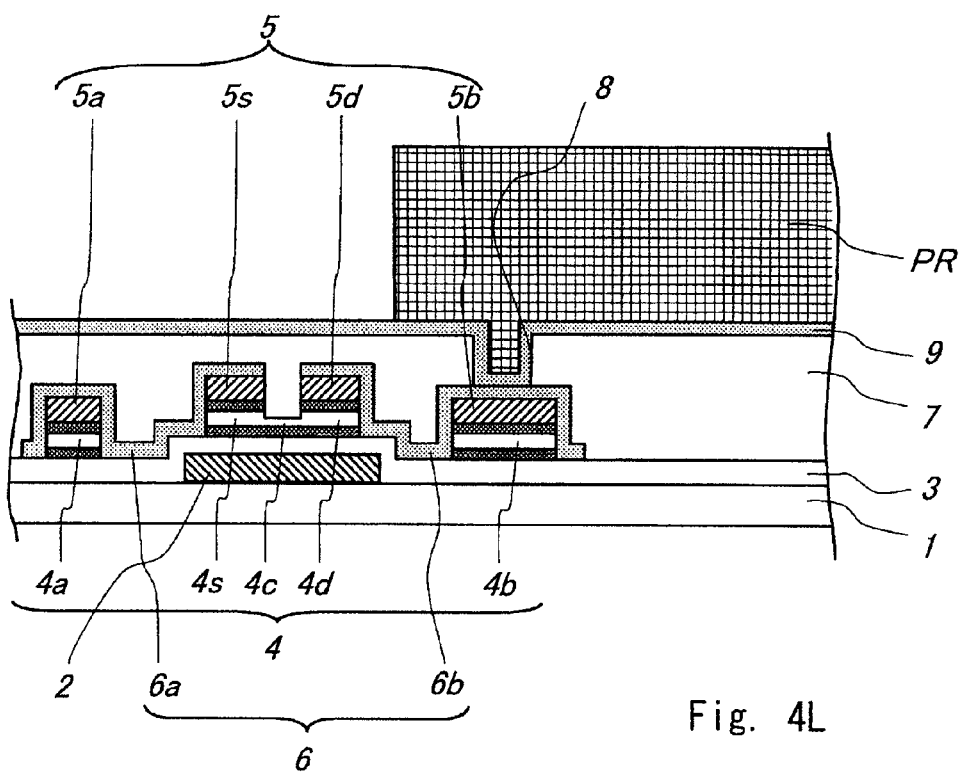
FIG. 4L is a manufacturing process view of the active matrix substrate of FIG. 1.

Then, a process step shown in FIG. 4L is performed.

An ITO film, for example, is deposited as the oxide conductive film 9 on the insulating film 7 by sputtering. Then, the fifth photolithography process is performed to form the pixel electrode 9. In order to connect the pixel electrode 9 to the drain line 5b through the contact hole 8, the photoresist pattern PR is formed to cover the formation area of the pixel electrode and the contact hole 8.

Figure 4M:
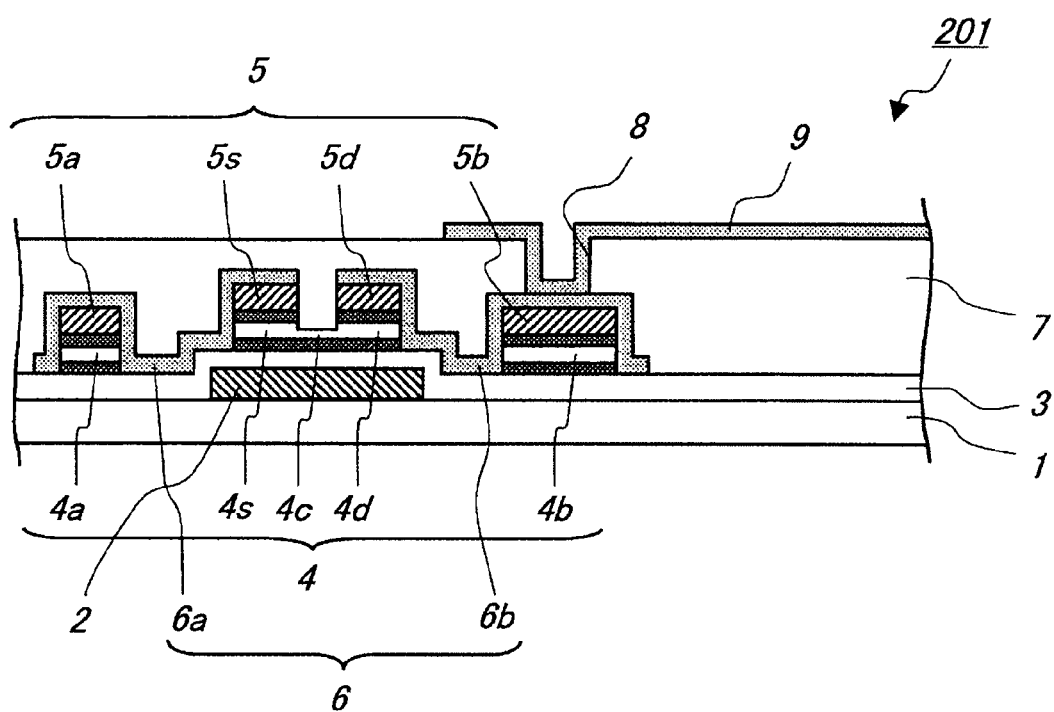
FIG. 4M is a manufacturing process view of the active matrix substrate of FIG. 1.

Then, a process step shown in FIG. 4M is performed.

The oxide conductive film 9 is etched using the above-described photoresist pattern PR as a mask, and then the photoresist pattern PR is peeled off.

The structure shown in FIG. 3 is obtained by the above process steps.

Although not shown, the storage capacitor 105, the gate line 106, the storage capacitor line 107, the draw line 109, the external terminal part and so on are also formed in addition.

Finally, an alignment film (not shown) is formed, and the active matrix substrate 201 is thereby produced.

(Alternative Example of Manufacturing Method)

In the second photolithography process shown in FIGS. 4D to 4G, two stages of photolithography process may be performed without using the halftone mask, which forms a photoresist pattern in which the channel region PRc is not a thin part but has the same thickness as the PRs and PRd in FIG. 4D, performs etching shown in FIG. 4E, peels off the photoresist pattern, and then forms the photoresist pattern shown in FIG. 4F, performs etching shown in FIG. 4F, and peels off the photoresist pattern.

Figure 5A:
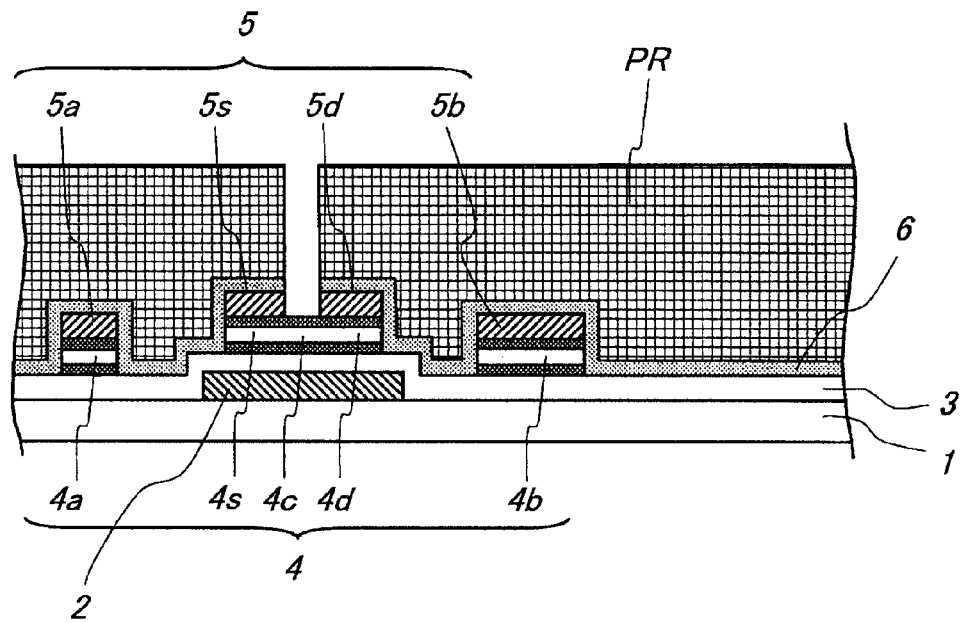
FIG. 5A is a manufacturing process view of the active matrix substrate of FIG. 1.
Figure 5B:
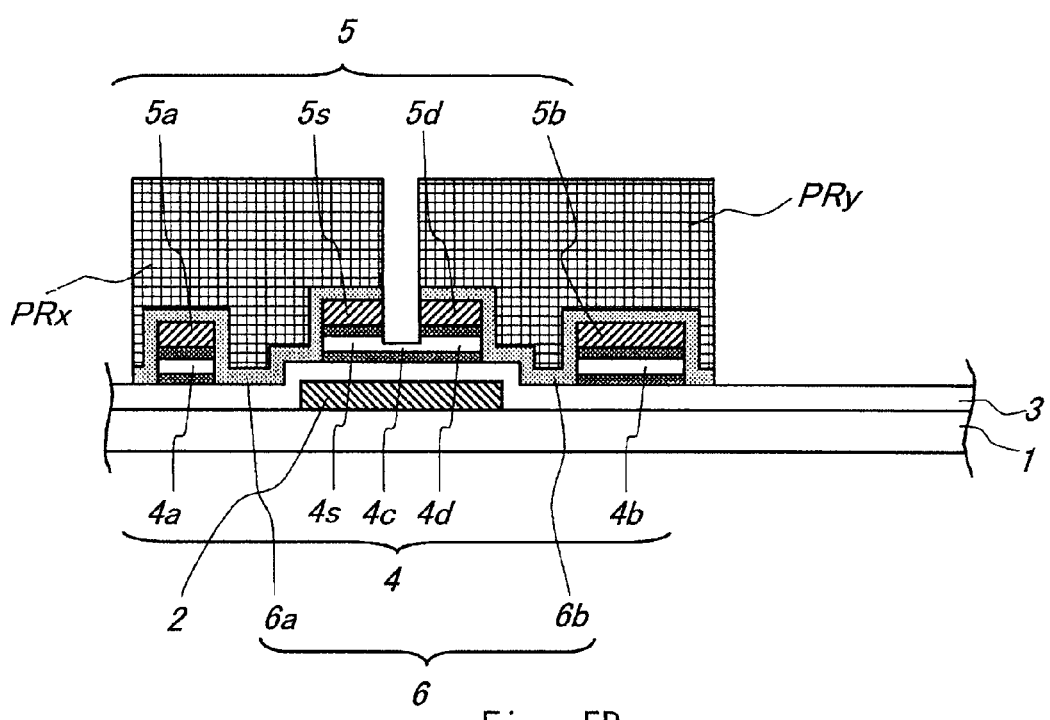
FIG. 5B is a manufacturing process view of the active matrix substrate of FIG. 1.

In the above-described two stages of photolithography process, the photoresist pattern in the second stage may be a pattern shown in FIG. 5A (the pattern having an opening only in the channel region), and etching may be performed as shown in FIG. 5B.

Instead of performing the process steps shown in FIGS. 4D to 4H, the process steps shown in FIGS. 5A to 5B may be performed.

A photoresist pattern in which the channel region PRc is not a thin part but has the same thickness as the PRs and PRd is formed in FIG. 4D, etching shown in FIG. 4E is performed, and the photoresist pattern is peeled off. After that, the oxide conductive film 6 is deposited by sputtering.

Then, the photoresist pattern PR in the pattern having an opening only in the channel region shown in FIG. 5A is formed, and the channel regions of the oxide conductive film 6 and the metal film 5 are etched using the photoresist pattern PR as a mask.

Next, the photoresist patterns PRx and Pry shown in FIG. 5B are formed. The oxide conductive film 6 is etched using the photoresist patterns PRx and Pry as a mask, and the channel region of the amorphous semiconductor film 43 doped with an N-type impurity is etched. After that, the photoresist patterns PRx and Pry are peeled off.

The structure of FIG. 4I can be obtained also in the above process.

Hereinafter, a manufacturing method of a liquid crystal device is described.

In the manufacture of the liquid crystal device, a plurality of active matrix substrates are formed in a mass in one large mother substrate for mass production efficiency.

FIG. 2 shows a mother active matrix substrate 10 in which a plurality of active matrix substrates 201a, 201b, . . . , 201n according to the exemplary embodiment described above are formed in an array in one mother substrate 1M. The plurality of active matrix substrates 201a, 201b, . . . , 201n are formed in a mass on the mother substrate 1M by the manufacturing method shown in FIGS. 4A to 4M.

As for the counter substrate (color filter substrate) which includes a counter electrode (common electrode), a color filter, a black matrix (BM) that blocks light between pixels, an alignment film and so on, a plurality of counter substrates are formed in a mass in one mother substrate.

The mother in which a plurality of active matrix substrates are formed and the mother substrate in which a plurality of counter substrates are formed are bonded together through a sealing material and a plurality of spherical spacers, it is cut into strip cells in which a plurality of liquid crystal panels are arranged in a single horizontal row, liquid crystals are infused by vacuum infusion and sealed to the plurality of liquid crystal panels arranged in a single horizontal row, the strip cell is cut into the respective liquid crystal panels, thereby producing each liquid crystal panel.

Note that liquid crystal dropping may be employed which applies a sealing material onto one mother substrate, drops liquid crystals in the sealing material, and then bonds two mother substrates together.

On the outer side of each liquid crystal panel obtained as above, a polarizing plate and a phase difference plate are attached.

The counter substrate is cut small so that the external terminal part of the active matrix substrate 201 is exposed without being covered with the counter substrate, and the IC chips 111 and 112 and the printed wiring board 110 are mounted in the exposed external terminal part.

Further, a backlight unit is attached on the side opposite to the viewing side of the liquid crystal panel.

Finally, the liquid crystal panel and optical elements on its outside are housed in a frame made of resin or metal, and the liquid crystal device is thereby completed.

In this exemplary embodiment, the channel layer of the pixel switching TFT 104 is made by a laminated film of the crystalline semiconductor film 41 and the amorphous semiconductor film 42.

Because the crystalline semiconductor film 41 has high carrier mobility, high field-effect mobility can be achieved. Further, a defect level due to crystal defect is suppressed by crystallization in the crystalline semiconductor film 41, and a threshold voltage shift can be reduced. Thus, by using the crystalline semiconductor film 41 as the channel layer, the TFT 104 with high driving capability and high reliability can be obtained.

The crystal grain diameter of the crystalline semiconductor film 41 is not particularly limited, and it is preferably 100 nm or less because the crystal grain diameter can be balanced and variation of TFT characteristics can be reduced.

In this exemplary embodiment, because the crystalline semiconductor film 41 is used as the channel layer of the pixel switching TFT 104, driving capability is higher than that of the a-Si TFT, and stable driving is possible even with a large drive voltage.

Therefore, a driver circuit such as a source driver or a gate driver can be configured using a drive TFT having the same device structure as the pixel switching TFT 104 and formed on the same substrate as the pixel area having the pixel switching TFT 104. This eliminates the need for an external IC chip, which enables reduction of parts cost, reduction of the number of manufacturing steps, improvement of productivity, reduction of a weight, and reduction of a frame area, thus being preferable.

In this exemplary embodiment, because the channel layer is a laminated film of the crystalline semiconductor film 41 and the amorphous semiconductor film 42, mismatching of a band gap at the interface between the non-doped amorphous semiconductor film 42 and the N-type amorphous semiconductor film 43 can be reduced to thereby suppress leakage current.

Generally, in the case of using a crystalline semiconductor film as a channel layer of a TFT, off-leakage current is likely to occur.

In this exemplary embodiment, a structure to suppress the off-leakage current is employed as described below, so that display defect such as display unevenness due to leakage current is suppressed.

In this exemplary embodiment, the channel layer composed of the crystalline semiconductor film 41 and the non-doped amorphous semiconductor film 42 and the ohmic contact layer composed of the amorphous semiconductor film 43 doped with an N-type impurity formed on the channel layer are formed within the formation area of the gate electrode 2, and the source electrode 5s and the drain electrode 5d are formed within the formation area of the channel layer and the ohmic contact layer.

In such a structure, the source electrode 5s and the drain electrode 5d are formed only on the laminated film of the channel layer and the ohmic contact layer and not in contact with its side face. This prevents off-leakage current from flowing to the source electrode 5s and the drain electrode 5d from the side face of the crystalline semiconductor film 41 constituting the channel layer.

In this exemplary embodiment, the source line 5a is formed above the gate insulating film 3 in the position spaced from the gate electrode 2, and the source line 5a is connected to the source electrode 5s through the connection line 6a made of an oxide conductive film which is formed on top of the source electrode 5s and extends from the top of the source electrode 5s.

Further, the drain line 5b is formed above the gate insulating film 3 in the position spaced from the gate electrode 2, and the drain line 5b is connected to the drain electrode 5d through the connection line 6b made of an oxide conductive film which is formed on top of the drain electrode 5d and extends from the top of the drain electrode 5d. Then, the drain line 5b and the pixel electrode 9 are electrically connected to each other through the contact hole 8 of the insulating film 7.

In this exemplary embodiment, the side faces of the channel layer and the ohmic contact layer on the source side and on the drain side are both covered with the connection lines 6a and 6b made of an oxide conductive film such as an ITO film.

In such a structure, the oxide film (silicon oxide film) is formed by oxygen supply from the connection lines 6a and 6b made of an oxide conductive film such as an ITO film at the interface between the side faces of the channel layer and the ohmic contact layer and the connection lines 6a and 6b spontaneously by thermal history in a process after the connection lines 6a and 6b are formed or by heat treatment performed after the connection lines 6a and 6b are formed.

In this structure, off-leakage current which flows from the side face of the crystalline semiconductor film 41 constituting the channel layer to the source line 5a and the drain line 5b can be suppressed, with the oxide film (silicon oxide film) formed at the interface between the side faces of the channel layer and the ohmic contact layer and the connection lines 6a and 6b serving as a barrier.

In this exemplary embodiment, because the channel layer and the ohmic contact layer are formed only within the formation area of the gate electrode 2, even when light from a backlight is applied from the backside of the gate electrode 2, the light is blocked by the gate electrode 2 and not applied to the channel layer and the ohmic contact layer.

Generally, when light is applied to a semiconductor film, an electron-hole pair is created in the semiconductor. However, because application of light to the channel layer and the ohmic contact layer is prevented by the gate electrode 2, off-leakage current due to the light application from the backlight can be suppressed.

In this exemplary embodiment, the semiconductor laminated films 4a and 4b in the same layer as the laminated film of the channel layer and the ohmic contact layer are left in the layer under the source line 5a and the drain line 5b.

In such a structure, light from a backlight is applied to the semiconductor laminated films 4a and 4b. However, the issue of the leakage current occurs when the TFT 104 is in the off-state and the gate electrode 2 is at a negative voltage. By the negative voltage of the gale electrode 2, a positive hole intends to flow to the TFT 104 side; however, even when an electron-hole pair is created by light application in the semiconductor laminated films 4a and 4b, the positive hole cannot move to the TFT 104 side because the connection lines 6a and 6b serve as a barrier. Thus, in this exemplary embodiment, off-leakage current due to light application from a backlight to the semiconductor laminated films 4a and 4b can be also suppressed.

In this exemplary embodiment, the source line 5a and the drain line 5b and the source electrode 5s and the drain electrode 5d are formed by the same film and the same process, and the connection line 6a and the connection line 6b are formed by the same film and the same process.

Therefore, the active matrix substrate 201 according to the exemplary embodiment can be manufactured at low cost without largely altering a manufacturing method of the existing a-Si TFT active matrix substrate.

As described above, according to the exemplary embodiment, the active matrix substrate 201 can be provided which includes the channel layer having the crystalline semiconductor film 41, which includes the TFT 104 with high driving capability, which can be manufactured at low cost without largely altering a manufacturing method of the existing a-Si TFT active matrix substrate, and which can reduce off-leakage current of the TFT.

By using the active matrix substrate 201 according to the exemplary embodiment, it is possible to provide a transmissive liquid crystal device with a high display quality.

Second Exemplary Embodiment

An active matrix substrate according to a second exemplary embodiment of the present invention is described hereinafter with reference to the drawings.

Figure 6:
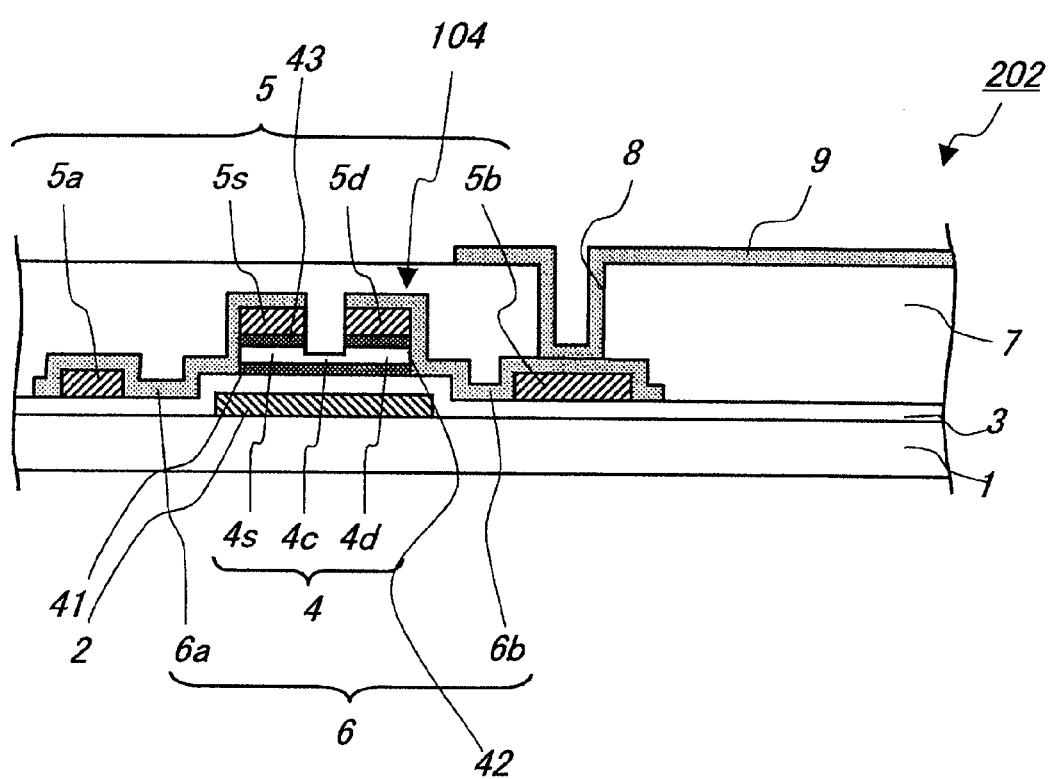
FIG. 6 is a substantial sectional view of an active matrix substrate according to a second exemplary embodiment of the present invention.

FIG. 6 is a substantial sectional view of the active matrix substrate according to the exemplary embodiment. The same elements as in the first exemplary embodiment are denoted by the same reference symbols and explanation thereof is omitted as appropriate.

The basic structure of an active matrix substrate 202 according to the second exemplary embodiment is the same as that of the active matrix substrate according to the first exemplary embodiment.

In the active matrix substrate 202 according to this exemplary embodiment also, the source line 5a electrically connected to the source electrode 5s and the drain line 5b electrically connected to the drain electrode 5d are formed above the gate insulating film 3 in the position spaced from the gate electrode 2. The source line 5a and the drain line 5b are made of the metal film 5 which is the same as that of the source electrode 5s and the drain electrode 5d.

In this exemplary embodiment also, the source line 5a and the source electrode 5s are connected through the connection line 6a having translucency and conductivity. The drain line 5b and the drain electrode 5d are connected through the connection line 6b having translucency and conductivity. The connection lines 6a and 6b are made of the same oxide conductive film 6. An indium tin oxide (ITO) film or the like is suitable as the oxide conductive film 6.

This exemplary embodiment is different from the first exemplary embodiment in that the semiconductor laminated films 4a and 4b in the layer under the source line 5a and the drain line 5b are removed, and the source line 5a and the drain line 5b are formed on top of the gate insulating film 3.

In this exemplary embodiment, the connection line 6a covers the top face of the source electrode 5s and the side face of the source electrode 5s on the source line 5a side, the side face of the laminated film of the channel layer and the ohmic contact layer on the source line 5a side, a region between the source electrode 5s and the source line 5a on the gate insulating film 3, and the side face and the top face of the source line 5a.

The connection line 6b covers the top face of the drain electrode 5d and the side face of the drain electrode 5d on the drain line 5b side, the side face of the laminated film of the channel layer and the ohmic contact layer on the drain line 5b side, a region between the drain electrode 5d and the drain line 5b on the gate insulating film 3, and the side face and the top face of the drain line 5b.

At the interface between the side face of the laminated film of the channel layer and the ohmic contact layer and the connection lines 6a and 6b or the like, an oxide film (silicon oxide film) is formed by oxygen supply from the oxide conductive film 6 made of ITO or the like.

In this exemplary embodiment, the source line 5a is formed on top of the gate insulating film 3 on the source electrode 5s side of the pixel switching TFT 104 in the region spaced from the pixel switching TFT 104, and the source line 5a and the source electrode 5s are connected through the connection line 6a having translucency and conductivity.

Likewise, the drain line 5b is formed on top of the gate insulating film 3 on the drain electrode 5d side of the pixel switching TFT 104 in the region spaced from the pixel switching TFT 104, and the drain line 5b and the drain electrode 5d are connected through the connection line 6b having translucency and conductivity.

A manufacturing method of the active matrix substrate 202 according to the exemplary embodiment is described hereinafter.

The crystalline semiconductor film 41 is formed by performing the process steps shown in FIGS. 4A to 4B in the same manner as in the manufacturing method according to the first exemplary embodiment. Next, the non-doped amorphous semiconductor film 42 and the amorphous semiconductor film 43 doped with an N-type impurity are deposited in succession.

Then, the photolithography process is performed, and the semiconductor laminated film 4 composed of the crystalline semiconductor film 41, the non-doped amorphous semiconductor film 42 and the amorphous semiconductor film 43 doped with an N-type impurity is thereby patterned so that it is left in an island shape only above the gate electrode 2. For the pattern of the semiconductor laminated film 4 left above the gate electrode 2, see FIG. 4E of the first exemplary embodiment. Although the semiconductor laminated film 4 is left also in the formation area of the source line 5a and the drain line 5b in FIG. 4E, the semiconductor laminated film 4 is not left in the formation area of the source line 5a and the drain line 5b in this exemplary embodiment.

Then, the metal film 5 is deposited by sputtering.

After that, the same process steps as shown in FIGS. 4D to 4M of the first exemplary embodiment are performed, and the active matrix substrate 202 according to the exemplary embodiment is thereby produced.

In this exemplary embodiment also, because the crystalline semiconductor film 41 is used as the channel layer of the pixel switching TFT 104, driving capability is higher than that of the a-Si TFT, and stable driving is possible even with a large drive voltage.

In this exemplary embodiment also, because the channel layer is the laminated film of the crystalline semiconductor film 41 and the non-doped amorphous semiconductor film 42, mismatching of a band gap at the interface between the non-doped amorphous semiconductor film 42 and the N-type amorphous semiconductor film 43 can be reduced to thereby suppress leakage current.

In this exemplary embodiment also, the channel layer composed of the crystalline semiconductor film 41 and the non-doped amorphous semiconductor film 42 and the ohmic contact layer composed of the amorphous semiconductor film 43 doped with an N-type impurity formed on the channel layer are formed within the formation area of the gate electrode 2, and the source electrode 5s and the drain electrode 5d are formed within the formation area of the channel layer and the ohmic contact layer.

In such a structure, the source electrode 5s and the drain electrode 5d are formed only on the laminated film of the channel layer and the ohmic contact layer and not in contact with its side face. This prevents off-leakage current from flowing to the source electrode 5s and the drain electrode 5d from the side face of the crystalline semiconductor film 41 constituting the channel layer.

In this exemplary embodiment also, the source line 5a is formed above the gate insulating film 3 in the position spaced from the gate electrode 2, and the source line 5a is connected to the source electrode 5s through the connection line 6a made of an oxide conductive film which is formed on top of the source electrode 5s and extends from the top of the source electrode 5s.

Further, the drain line 5b is formed above the gate insulating film 3 in the position spaced from the gate electrode 2, the drain line 5b is connected to the drain electrode 5d through the connection line 6b made of an oxide conductive film which is formed on top of the drain electrode 5d and extends from the top of the drain electrode 5d. Then, the drain line 5b and the pixel electrode 9 are electrically connected to each other through the contact hole 8 of the insulating film 7.

In this exemplary embodiment also, the side faces of the laminated film of the channel layer and the ohmic contact layer on the source side and on the drain side are both covered with the connection lines 6a and 6b made of an oxide conductive film such as an ITO film.

In this exemplary embodiment also, the oxide film (silicon oxide film) is formed by oxygen supply from the connection lines 6a and 6b made of an oxide conductive film such as an ITO film at the interface between the side faces of the laminated film of the channel layer and the ohmic contact layer and the connection lines 6a and 6b spontaneously by thermal history in a process after the connection lines 6a and 6b are formed or by heat treatment performed after the connection lines 6a and 6b are formed.

In this exemplary embodiment also, off-leakage current which flows from the side face of the crystalline semiconductor film 41 constituting the channel layer to the source line 5a and the drain line 5b can be suppressed, with the oxide film (silicon oxide film) formed at the interface between the side faces of the laminated film of the channel layer and the ohmic contact layer and the connection lines 6a and 6b serving as a barrier.

In this exemplary embodiment also, because the channel layer and the ohmic contact layer are formed only within the formation area of the gate electrode 2, even when light from a backlight is applied from the backside of the gate electrode 2, the light is blocked by the gate electrode 2 and not applied to the channel layer and the ohmic contact layer.

Generally, when light is applied to a semiconductor film, an electron-hole pair is created in the semiconductor. However, because application of light to the channel layer and the ohmic contact layer is prevented by the gate electrode 2, off-leakage current due to the light application from the backlight can be suppressed.

In the first exemplary embodiment, because the semiconductor laminated films 4a and 4b in the same layer as the laminated film of the channel layer and the ohmic contact layer are left in the layer under the source line 5a and the drain line 5b, light from a backlight is applied to the semiconductor laminated films 4a and 4b, and an electron-hole pair is created in the semiconductor. As described in the first exemplary embodiment, the electron-hole pair generated in the semiconductor laminated films 4a and 4b does not cause the problem of the off-leakage current. However, there is a possibility that the source line 5a and the drain line 5b are affected, if only slightly, by photocurrent flowing through the semiconductor laminated films 4a and 4b. For example, there is a possibility that a signal of the source line 5a is affected.

In this exemplary embodiment, because the semiconductor laminated films 4a and 4b in the same layer as the laminated film of the channel layer and the ohmic contact layer are not left in the layer under the source line 5a and the drain line 5b, it is possible to suppress the effect of photocurrent on the source line 5a and the drain line 5b, and therefore display characteristics which are even higher than those in the first exemplary embodiment can be obtained.

In this exemplary embodiment also, the source line 5a and the drain line 5b and the source electrode 5s and the drain electrode 5d are formed by the same film and the same process, and the connection line 6a and the connection line 6b are formed by the same film and the same process.

Therefore, the active matrix substrate 202 according to the exemplary embodiment can also be manufactured at low cost without largely altering a manufacturing method of the existing a-Si TFT active matrix substrate.

As described above, according to the exemplary embodiment, the active matrix substrate 202 can be provided which includes the channel layer having the crystalline semiconductor film 41, which includes the TFT 104 with high driving capability, which can be manufactured at low cost without largely altering a manufacturing method of the existing a-Si TFT active matrix substrate, and which can reduce off-leakage current of the TFT.

Third Exemplary Embodiment

An active matrix substrate according to a third exemplary embodiment of the present invention is described hereinafter with reference to the drawings.

Figure 7:
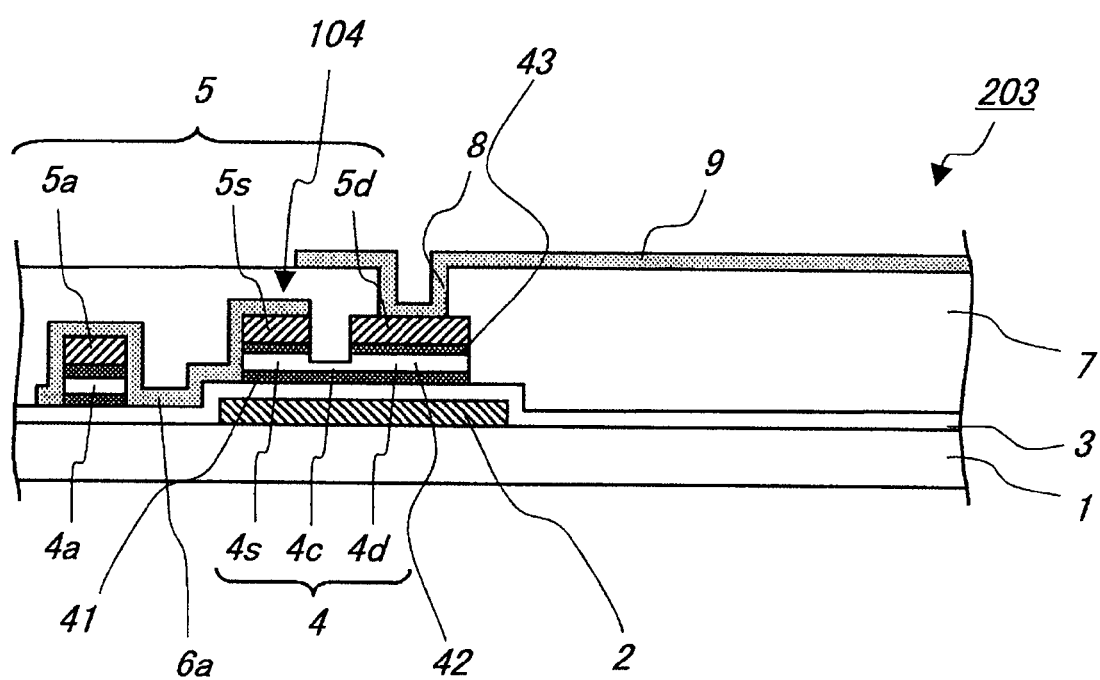
FIG. 7 is a substantial sectional view of an active matrix substrate according to a third exemplary embodiment of the present invention.

FIG. 7 is a substantial sectional view of the active matrix substrate according to the exemplary embodiment. The same elements as in the first exemplary embodiment are denoted by the same reference symbols and explanation thereof is omitted as appropriate.

An active matrix substrate 203 according to the exemplary embodiment has the same structure on the source electrode side as that of the active matrix substrate according to the first exemplary embodiment.

The semiconductor laminated film 4a in the same layer as the laminated film of the channel layer and the ohmic contact layer of the pixel switching TFT 104 is left on the source electrode 5s side of the pixel switching TFT 104 in the region spaced from the pixel switching TFT 104, the source line 5a is formed on the semiconductor laminated film 4a, and the source line 5a and the source electrode 5s are connected through the connection line 6a having translucency and conductivity.

The active matrix substrate 203 according to the exemplary embodiment does not have the drain line 5b and the semiconductor laminated film 4b in its under layer on the drain electrode side, and the drain electrode 5d is connected to the pixel electrode 9 through the contact hole 8.

In this exemplary embodiment also, because the crystalline semiconductor film 41 is used as the channel layer of the pixel switching TFT 104, driving capability is higher than that of the a-Si TFT, and stable driving is possible even with a large drive voltage.

In this exemplary embodiment also, because the channel layer is the laminated film of the crystalline semiconductor film 41 and the non-doped amorphous semiconductor film 42, mismatching of a band gap at the interface between the non-doped amorphous semiconductor film 42 and the N-type amorphous semiconductor film 43 can be reduced to thereby suppress leakage current.

In this exemplary embodiment also, the channel layer composed of the crystalline semiconductor film 41 and the non-doped amorphous semiconductor film 42 and the ohmic contact layer composed of the amorphous semiconductor film 43 doped with an N-type impurity formed on the channel layer are formed within the formation area of the gate electrode 2, and the source electrode 5s and the drain electrode 5d are formed within the formation area of the channel layer and the ohmic contact layer.

In such a structure, the source electrode 5s and the drain electrode 5d are formed only on the laminated film of the channel layer and the ohmic contact layer and not in contact with its side face. This prevents off-leakage current from flowing to the source electrode 5s and the drain electrode 5d from the side face of the crystalline semiconductor film 41 constituting the channel layer.

In this exemplary embodiment also, the source line 5a is formed above the gate insulating film 3 in the position spaced from the gate electrode 2, and the source line 5a is connected to the source electrode 5s through the connection line 6a made of an oxide conductive film which is formed on top of the source electrode 5s and extends from the top of the source electrode 5s.

In this exemplary embodiment also, the side face of the laminated film of the channel layer and the ohmic contact layer on the source side is covered with the connection line 6a made of an oxide conductive film such as an ITO film.

In this exemplary embodiment also, the oxide film (silicon oxide film) is formed by oxygen supply from the connection line 6a made of an oxide conductive film such as an ITO film at the interface between the side face of the laminated film of the channel layer and the ohmic contact layer on the source side and the connection line 6a spontaneously by thermal history in a process after the connection line 6a is formed or by heat treatment performed after the connection line 6a is formed.

In this exemplary embodiment also, off-leakage current which flows from the side face of the crystalline semiconductor film 41 constituting the channel layer to the source line 5a can be suppressed, with the oxide film (silicon oxide film) formed at the interface between the side face of the laminated film of the channel layer and the ohmic contact layer on the source side and the connection line 6a serving as a barrier.

Differently from the first exemplary embodiment, the drain line 5b and the connection line 6b are not included in this exemplary embodiment, and the drain electrode 5d and the pixel electrode 9 are electrically connected through the contact hole 8 of the insulating film 7.

Because the drain line 5b is eliminated in this exemplary embodiment, the area occupied by the pixel electrode 9 is enlarged. The open area ratio of the pixel electrode 9 is thus larger in this exemplary embodiment, and a liquid crystal device with high transmittance can be obtained.

As described in the first exemplary embodiment, in order to turn off the TFT, a reverse bias negative voltage is applied to the gate electrode 2, and, at this time, a high electric field is generated between the gate electrode 2 and the source and drain electrodes 5s and 5d. Generally in the pixel switching TFT, a high electric field on the drain electrode side, particularly, is problematic.

In this exemplary embodiment, the side face of the laminated film of the channel layer and the ohmic contact layer on the drain side is not in contact with the drain electrode 5d or the connection line 6b and is covered with the insulating film 7. In such a structure, light leakage current on the drain electrode 5d side is suppressed more than in the first exemplary embodiment.

In this exemplary embodiment also, because the channel layer and the ohmic contact layer are formed only within the formation area of the gate electrode 2, even when light from a backlight is applied from the backside of the gate electrode 2, the light is blocked by the gate electrode 2 and not applied to the channel layer and the ohmic contact layer.

Generally, when light is applied to a semiconductor film, an electron-hole pair is created in the semiconductor. However, because application of light to the channel layer and the ohmic contact layer is prevented by the gate electrode 2, off-leakage current due to the light application from the backlight can be suppressed.

In this exemplary embodiment also, the source line 5a, the source electrode 5s and the drain electrode 5d are formed by the same film and the same process.

Therefore, the active matrix substrate 203 according to the exemplary embodiment can also be manufactured at low cost without largely altering a manufacturing method of the existing a-Si TFT active matrix substrate.

As described above, according to the exemplary embodiment, the active matrix substrate 203 can be provided which includes the channel layer having the crystalline semiconductor film 41, which includes the TFT 104 with high driving capability, which can be manufactured at low cost without largely altering a manufacturing method of the existing a-Si TFT active matrix substrate, and which can reduce off-leakage current of the TFT.

Fourth Exemplary Embodiment

An active matrix substrate according to a fourth exemplary embodiment of the present invention is described hereinafter with reference to the drawings.

Figure 8:
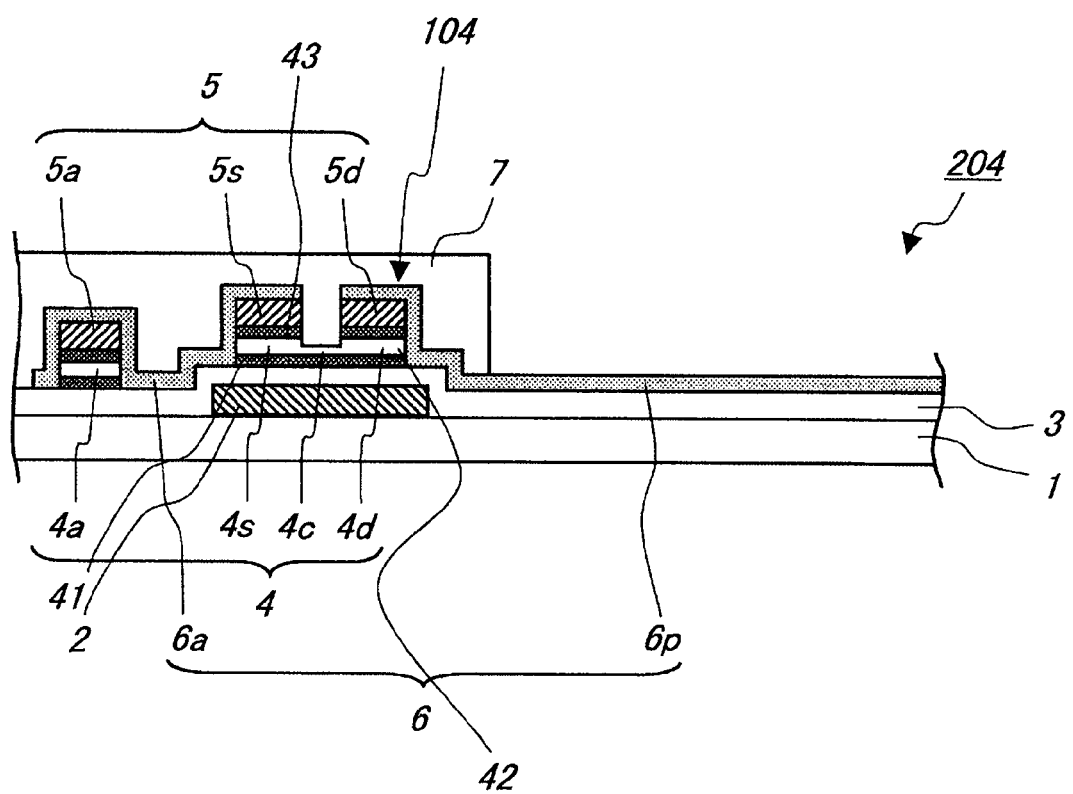
FIG. 8 is a substantial sectional view of an active matrix substrate according to a fourth exemplary embodiment of the present invention.

FIG. 8 is a substantial sectional view of the active matrix substrate according to the exemplary embodiment. The same elements as in the first exemplary embodiment are denoted by the same reference symbols and explanation thereof is omitted as appropriate.

An active matrix substrate 204 according to the exemplary embodiment has the same structure on the source electrode side as that of the active matrix substrate according to the first exemplary embodiment.

The semiconductor laminated film 4a in the same layer as the laminated film of the channel layer and the ohmic contact layer of the pixel switching TFT 104 is left on the source electrode 5s side of the pixel switching TFT 104 in the region spaced from the pixel switching TFT 104, the source line 5a is formed on the semiconductor laminated film 4a, and the source line 5a and the source electrode 5s are connected through the connection line 6a having translucency and conductivity.

In the active matrix substrate 204 according to the exemplary embodiment, the drain line 5b and the semiconductor laminated film 4b in its under layer are not included on the drain electrode side, and a pixel electrode 6p is formed by an oxide conductive film which is formed on top of the drain electrode 5d and extends from the top of the drain electrode 5d.

The connection line 6a and the pixel electrode 6p are made of the same oxide conductive film 6.

In this exemplary embodiment, the drain electrode 5d and the pixel electrode 6p are in direct contact with each other.

Further, the insulating film 7 is formed in a pattern which does not cover the large part of the pixel electrode 6p.

In this exemplary embodiment also, because the crystalline semiconductor film 41 is used as the channel layer of the pixel switching TFT 104, driving capability is higher than that of the a-Si TFT, and stable driving is possible even with a large drive voltage.

In this exemplary embodiment also, because the channel layer is the laminated film of the crystalline semiconductor film 41 and the non-doped amorphous semiconductor film 42, mismatching of a band gap at the interface between the non-doped amorphous semiconductor film 42 and the N-type amorphous semiconductor film 43 can be reduced to thereby suppress leakage current.

In this exemplary embodiment also, the channel layer composed of the crystalline semiconductor film 41 and the non-doped amorphous semiconductor film 42 and the ohmic contact layer composed of the amorphous semiconductor film 43 doped with an N-type impurity formed on the channel layer are formed within the formation area of the gate electrode 2, and the source electrode 5s and the drain electrode 5d are formed within the formation area of the channel layer and the ohmic contact layer.

In such a structure, the source electrode 5s and the drain electrode 5d are formed only on the laminated film of the channel layer and the ohmic contact layer and not in contact with its side face. This prevents off-leakage current from flowing to the source electrode 5s and the drain electrode 5d from the side face of the crystalline semiconductor film 41 constituting the channel layer.

In this exemplary embodiment also, the source line 5a is formed above the gate insulating film 3 in the position spaced from the gate electrode 2, and the source line 5a is connected to the source electrode 5s through the connection line 6a made of an oxide conductive film which is formed on top of the source electrode 5s and extends from the top of the source electrode 5s.

In this exemplary embodiment also, the side face of the laminated film of the channel layer and the ohmic contact layer on the source side is covered with the connection line 6a made of an oxide conductive film such as an ITO film.

In this exemplary embodiment also, the oxide film (silicon oxide film) is formed by oxygen supply from the connection line 6a made of an oxide conductive film such as an ITO film at the interface between the side face of the laminated film of the channel layer and the ohmic contact layer on the source side and the connection line 6a spontaneously by thermal history in a process after the connection line 6a is formed or by heat treatment performed after the connection line 6a is formed.

In this exemplary embodiment also, off-leakage current which flows from the side face of the crystalline semiconductor film 41 constituting the channel layer to the source line 5a can be suppressed, with the oxide film (silicon oxide film) formed at the interface between the side face of the laminated film of the channel layer and the ohmic contact layer on the source side and the connection line 6a serving as a barrier.

Differently from the first exemplary embodiment, the drain line 5b and the connection line 6b are not included in this exemplary embodiment, and a pixel electrode 6p is formed by an oxide conductive film such as an ITO film which is formed on top of the drain electrode 5d and extends from the top of the drain electrode 5d to the outside of the formation area of the gate electrode 2 on the gate insulating film 3.

In this exemplary embodiment, the side face of the laminated film of the channel layer and the ohmic contact layer on the drain side is covered with the pixel electrode 6p made of the oxide conductive film.

In this exemplary embodiment, the oxide film (silicon oxide film) is formed by oxygen supply from the pixel electrode 6p made of an oxide conductive film such as an ITO film at the interface between the side face of the laminated film of the channel layer and the ohmic contact layer on the drain side and the pixel electrode 6p spontaneously by thermal history in a process after the pixel electrode 6p is formed or by heat treatment performed after the pixel electrode 6p is formed.

In this exemplary embodiment, off-leakage current which flows from the side face of the crystalline semiconductor film 41 constituting the channel layer to the pixel electrode 6p can be suppressed, with the oxide film (silicon oxide film) formed at the interface between the side face of the laminated film of the channel layer and the ohmic contact layer on the drain side and the pixel electrode 6p serving as a barrier.

Because the need for the drain line 5b and the contact hole 8 is eliminated in this exemplary embodiment, the open area ratio of the pixel electrode 6p can be larger, and therefore a liquid crystal device with higher transmittance than in the first to third exemplary embodiments can be obtained.

In this exemplary embodiment also, because the channel layer and the ohmic contact layer are formed only within the formation area of the gate electrode 2, even when light from a backlight is applied from the backside of the gate electrode 2, the light is blocked by the gate electrode 2 and not applied to the channel layer and the ohmic contact layer.

Generally, when light is applied to a semiconductor film, an electron-hole pair is created in the semiconductor. However, because application of light to the channel layer and the ohmic contact layer is prevented by the gate electrode 2, off-leakage current due to the light application from the backlight can be suppressed.

In this exemplary embodiment, the source line 5a, the source electrode 5s and the drain electrode 5d are formed by the same film and the same process, and the connection line 6a and the pixel electrode 6p are formed by the same film and the same process.

In this exemplary embodiment, because there is no need to make the contact hole 8 in the insulating film 7 and form the pixel electrode 9 on the insulating film 7, the photomask process can be reduced compared to the first to third exemplary embodiments.

Therefore, the active matrix substrate 204 according to the exemplary embodiment can also be manufactured at low cost without largely altering a manufacturing method of the existing a-Si TFT active matrix substrate.

As described above, according to the exemplary embodiment, the active matrix substrate 204 can be provided which includes the channel layer having the crystalline semiconductor film 41, which includes the TFT 104 with high driving capability, which can be manufactured at low cost without largely altering a manufacturing method of the existing a-Si TFT active matrix substrate, and which can reduce off-leakage current of the TFT.

Fifth Exemplary Embodiment

An active matrix substrate according to a fifth exemplary embodiment of the present invention is described hereinafter with reference to the drawings.

Figure 9:
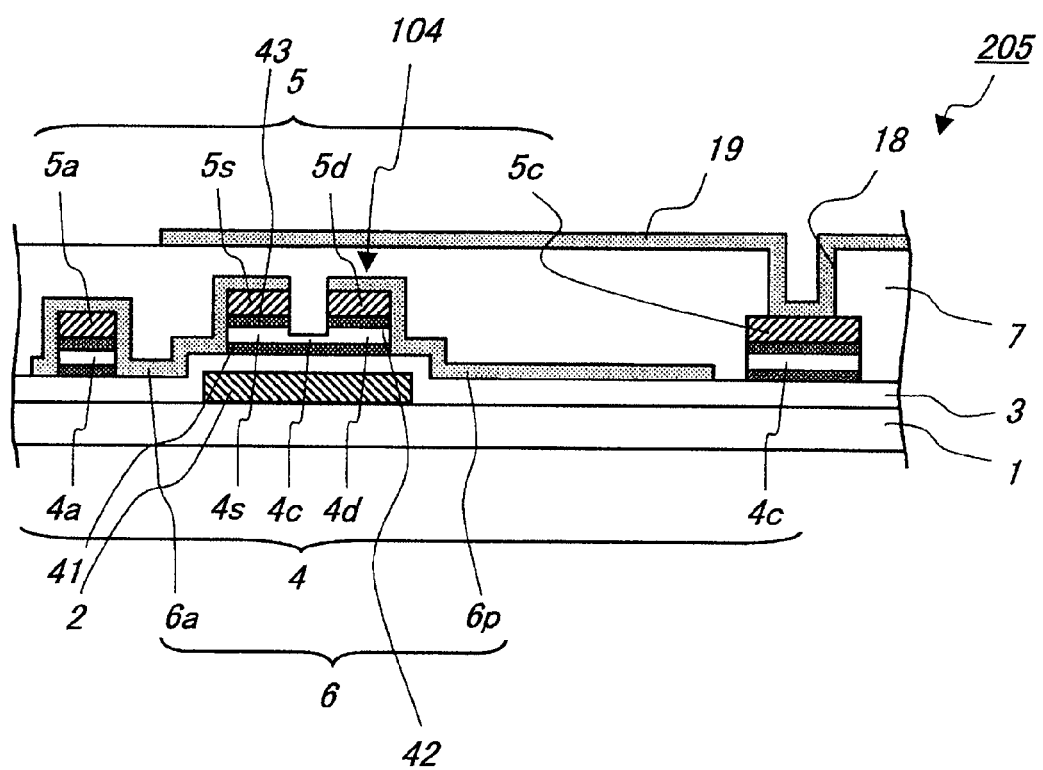
FIG. 9 is a substantial sectional view of an active matrix substrate according to a fifth exemplary embodiment of the present invention.

FIG. 9 is a substantial sectional view of the active matrix substrate according to the exemplary embodiment. The same elements as in the third exemplary embodiment are denoted by the same reference symbols and explanation thereof is omitted as appropriate.

An active matrix substrate 205 according to this exemplary embodiment is an active matrix substrate for a fringe field switching (FFS) mode liquid crystal device.

The FFS mode is a display scheme in which a pixel electrode and a counter electrode are placed on the active matrix substrate side and which performs display by applying a fringe electric field to liquid crystals.

In this exemplary embodiment, an oxide conductive film is used both for the pixel electrode and the counter electrode because high transmittance can be obtained.

The active matrix substrate 205 according to the exemplary embodiment has the structure similar to that of the third embodiment.

The semiconductor laminated film 4a in the same layer as the laminated film of the channel layer and the ohmic contact layer of the pixel switching TFT 104 is left on the source electrode 5s side of the pixel switching TFT 104 in the region spaced from the pixel switching TFT 104, the source line 5a is formed on the semiconductor laminated film 4a, and the source line 5a and the source electrode 5s are connected through the connection line 6a having translucency and conductivity.

In the active matrix substrate 205 according to the exemplary embodiment, the drain line 5b and the semiconductor laminated film 4b in its under layer are not included on the drain electrode side, and a pixel electrode 6p is formed by an oxide conductive film which is formed on top of the drain electrode 5d and extends from the top of the drain electrode 5d.

The connection line 6a and the pixel electrode 6p are made of the same oxide conductive film 6.

The active matrix substrate 205 according to the exemplary embodiment further includes a counter electrode 19.

In this exemplary embodiment, the counter electrode 19 composed of a plurality of electrodes with the same potential, which are stripe-like when viewed from above having a plurality of elongated openings being comb-shaped or slit-shaped when viewed from above is formed opposite to the pixel electrode 6p which are flat plate-shaped having no opening when viewed from above, with the insulating film 7 interposed therebetween (the planar shape is not shown).

In this exemplary embodiment, the counter electrode 19 is connected to a common line 5c formed by the same metal film 5 as the source electrode 5s, the drain electrode 5d and the source line 5a through a contact hole 18 of the insulating film 7. Further, a semiconductor laminated film 4c in the same layer as the laminated film of the channel layer and the ohmic contact layer is formed in the layer under the common line 5c.

The common line 5c may be formed at the same time as the gate electrode 2, and, in this case, the contact hole 18 is made to penetrate through the insulating film 7 and the gate insulating film 3.

In the fifth exemplary embodiment, the manufacturing method of the first embodiment can be applied as it is, and explanation thereof is omitted herein.

The basic structure of this exemplary embodiment is the same as that of the fourth exemplary embodiment, and the counter electrode 19 opposite to the pixel electrode 6p is further placed on the same substrate.

Therefore, the same advantageous effects as in the fourth exemplary embodiment can be obtained in this exemplary embodiment as well.

In this embodiment, the source line 5a and the source electrode 5s and the drain electrode 5d and the common line 5c are formed by the same film and the same process, and the connection line 6a and the pixel electrode 6p are formed by the same film and the same process.

In this exemplary embodiment also, like the fourth exemplary embodiment, there is no need to make the contact hole 8 in the insulating film 7 and form the pixel electrode 9 on the insulating film 7. Therefore, even when the contact hole 18 is made in the insulating film 7, and the counter electrode 19 is formed on the insulating film 7, the active matrix substrate 205 can be manufactured with the same number of steps as in the first embodiment, and the FFS mode active matrix substrate 205 can be manufactured with the minimum number of photomask process steps. Thus, in this exemplary embodiment, the FFS mode active matrix substrate 205 having the same advantageous effects as in the first exemplary embodiment can be manufactured without an increase in the number of photomask process steps. In this exemplary embodiment, productivity improvement and cost reduction of the FFS mode liquid crystal device can be achieved, and more superior display characteristics can be obtained.

As described above, according to the exemplary embodiment, the FFS mode active matrix substrate 205 can be provided which includes the channel layer having the crystalline semiconductor film 41, which includes the TFT 104 with high driving capability, which can be manufactured at low cost without largely altering a manufacturing method of the existing a-Si TFT active matrix substrate, and which can reduce off-leakage current of the TFT.

In this exemplary embodiment, an upper electrode composed of a plurality of stripe-like electrodes when viewed from above in the FFS mode is formed using a counter electrode connected to a common line, and a lower electrode composed of a flat plate-shaped electrode when viewed from above disposed in the under layer of the upper electrode in an overlapping fashion is formed using a pixel electrode connected to a drain electrode. In the FFS mode, an electric field is applied between the upper electrode and the lower electrode, and the positions of the pixel electrode and the counter electrode may be opposite.

Specifically, in the structure of FIG. 9, the pixel electrode 6p may function as the counter electrode if it is connected to the common line 5c without connected to the drain electrode 5d, and the counter electrode 19 may function as the pixel electrode if it is connected to the drain electrode 5d through the contact hole 8 of the insulating film 7 in the same manner as in FIG. 7.

In such a design change, the pixel electrode serves as the upper electrode of the FFS mode, and therefore it is preferred to be composed of a plurality of stripe-like electrodes when viewed from above with the same potential, having a plurality of elongated openings being comb-shaped or slit-shaped when viewed from above, just like the counter electrode 19 in the fifth exemplary embodiment. On the other hand, because the counter electrode serves as the lower electrode of the FFS mode, it is preferred to be composed of a flat plate-shaped electrode with no opening when viewed from above, just like the pixel electrode 6p in the fifth exemplary embodiment.

In the above design alternation, the counter electrode (lower electrode) formed by connecting the pixel electrode 6p to the common line 5c without connecting it to the drain electrode 5d is preferably made of the same oxide conductive film 6 as the connection line 6a as in the fifth exemplary embodiment, and, in this case, it can be formed by the same film and the same process as the connection line 6a.

In the above-design change as well, the FFS mode active matrix substrate can be manufactured without an increase in the number of photomask process steps as in the fifth exemplary embodiment, and productivity improvement and cost reduction of the FFS mode liquid crystal device can be achieved, and superior display characteristics can be obtained.

Although the FFS mode active matrix substrate is described in the fifth exemplary embodiment and its alternative design example, the flat plate-shaped lower electrode made of the oxide conductive film in the FFS mode may be a plurality of stripe-like electrodes just like the upper electrode. By such design alternation, an active matrix substrate of an in-plane switching mode which is similar to the FFS mode can be provided. In such a design change as well, the lower electrode made of an oxide conductive film may be formed using the same oxide conductive film 6 as the connection line 6a, so that it can be formed by the same film and the same process as the connection line 6a, and therefore the same advantageous effects as above can be obtained.

[Alternative Design]

The present invention is not limited to the above-described exemplary embodiments, and design change may be made without departing from the spirit and scope of the invention.

Although the active matrix substrate using the laminated film of the crystalline semiconductor film 41 and the non-doped amorphous semiconductor film 42 as the channel layer is described in the above exemplary embodiments, the present invention is applicable to the active matrix substrate which includes the channel layer having an arbitrary structure composed of a crystalline semiconductor film and/or an amorphous semiconductor film, and the same advantageous effects can be obtained.

However, the present invention is more effective for the active matrix substrate which uses a crystalline semiconductor film with higher hole mobility than an amorphous semiconductor film and in which off-leakage current is more likely to occur.

From the invention thus described, it will be obvious that the exemplary embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An active matrix substrate comprising:
a plurality of pairs of an inverted staggered thin film transistor and a pixel electrode arranged in an array, the thin film transistor including
a gate electrode and a gate insulating film sequentially formed on an insulating substrate,
a channel layer made of at least one of a crystalline semiconductor film and an amorphous semiconductor film formed on the gate insulating film, and
a source electrode and a drain electrode formed spaced from each other on the channel layer, wherein
the channel layer is formed within a formation area of the gate electrode,
the source electrode and the drain electrode are formed within a formation area of the channel layer, and
a source line is formed above the gate insulating film in a position spaced from the gate electrode, and the source line is connected to the source electrode through a connection line made of an oxide conductive film formed on top of the source electrode and extending from the top of the source electrode.

2. The active matrix substrate according to claim 1, wherein a semiconductor film in the same layer as the channel layer is formed above the gate insulating film in an under layer of the source line.

3. The active matrix substrate according to claim 1, wherein
a drain line is formed above the gate insulating film in a position spaced from the gate electrode, and the drain line is connected to the drain electrode through a connection line made of an oxide conductive film formed on top of the drain electrode and extending from the top of the drain electrode,
an insulating film covering the source electrode, the drain electrode, the source line and the drain line is formed,
the pixel electrode is formed on the insulating film, and
the drain line and the pixel electrode are electrically connected through a contact hole of the insulating film.

4. The active matrix substrate according to claim 3, wherein a semiconductor film in the same layer as the channel layer is formed above the gate insulating film in an under layer of the drain line.

5. The active matrix substrate according to claim 1, wherein
an insulating film covering the source electrode, the drain electrode and the source line is formed,
the pixel electrode is formed on the insulating film, and
the drain electrode and the pixel electrode are electrically connected through a contact hole of the insulating film.

6. The active matrix substrate according to claim 1, wherein the pixel electrode is an oxide conductive film formed on top of the drain electrode and extending from the top of the drain electrode to an outside of the formation area of the gate electrode on the gate insulating film.

7. The active matrix substrate according to claim 6, wherein the connection line and the pixel electrode are formed by the same film.

8. The active matrix substrate according to claim 1, wherein an oxide film is formed at an interface between a side face of the channel layer and the connection line.

9. The active matrix substrate according to claim 1, wherein the channel layer is a laminated film of a crystalline semiconductor film and an amorphous semiconductor film.

10. The active matrix substrate according to claim 1, wherein
the insulating substrate is a translucent substrate, and
the connection line and the pixel electrode are made of a translucent conductive material.

11. The active matrix substrate according to claim 10, further comprising:
a counter electrode made of a translucent conductive material and placed opposite to the pixel electrode.

12. The active matrix substrate according to claim 5, wherein
the connection line and the pixel electrode are made of a translucent conductive material, and
a counter electrode formed by the same film as the connection line and placed opposite to the pixel electrode are placed above the gate insulating film.

13. The active matrix substrate according to claim 10, wherein the translucent conductive material is indium tin oxide.

14. The active matrix substrate according to claim 12, wherein the translucent conductive material is indium tin oxide.

15. The active matrix substrate according to claim 8, wherein the oxide film is formed spontaneously by thermal history in a process after the connection line is formed or by heat treatment performed after the connection line is formed.

16. The active matrix substrate according to claim 1, wherein the source line, the source electrode and the drain electrode are formed by the same film.

17. The active matrix substrate according to claim 3, wherein the drain line, the source electrode and the drain electrode are formed by the same film.

18. A liquid crystal device comprising a liquid crystal panel including:
the active matrix substrate according to claim 1;
a counter substrate; and
a liquid crystal layer interposed between the active matrix substrate and the counter substrate.

19. The liquid crystal device according to claim 18, further comprising a backlight.

* * * * *